US006313482B1

(12) United States Patent
Baliga

(10) Patent No.: US 6,313,482 B1
(45) Date of Patent: Nov. 6, 2001

(54) SILICON CARBIDE POWER DEVICES HAVING TRENCH-BASED SILICON CARBIDE CHARGE COUPLING REGIONS THEREIN

(75) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/312,980

(22) Filed: May 17, 1999

(51) Int. Cl.[7] ............................................... H01L 31/0312
(52) U.S. Cl. ........................ 257/77; 257/168; 257/266; 257/267; 257/279
(58) Field of Search ............................. 257/77, 168, 266, 257/267, 280, 339, 409, 471, 472, 487, 492, 493, 653, 654

(56) References Cited

U.S. PATENT DOCUMENTS

| | | | |
|---|---|---|---|
| 4,375,124 | 3/1983 | Cogan | 29/571 |
| 4,587,712 | 5/1986 | Baliga | 29/571 |
| 4,646,115 | 2/1987 | Shannon et al. | 357/15 |
| 4,754,310 | 6/1988 | Coe | 357/13 |
| 4,835,586 | 5/1989 | Cogan et al. | 357/23.14 |
| 4,866,495 | 9/1989 | Kinzer | 357/23.4 |
| 4,941,026 | 7/1990 | Temple | 357/23.4 |
| 4,982,260 | * 1/1991 | Chang et al. | 357/38 |

(List continued on next page.)

FOREIGN PATENT DOCUMENTS

| | | |
|---|---|---|
| 197 40 195 A1 | 3/1999 | (DE) . |
| WO 98/32177 | 7/1998 | (WO) . |
| WO 98/34283 | 8/1998 | (WO) . |
| WO 98/35390 | 8/1998 | (WO) . |

OTHER PUBLICATIONS

Kawaguchi et al., "Predicted Electrical Characteristics of 4500 V Super Multi–Resurf MOSFETs," The 11th International Symposium on Power Semiconductor Devices and IC's, Crowne Plaza, Toronto, Ontario, Canada, May 26–28, 1999, pp. 95–98.

Kinzer et al., "Ultra–Low Rdson 12 v P–channel trench MOSFET," The 11th International Symposium on Power Semiconductor Devices and IC's, Crowne Plaza, Toronto, Ontario, Canada, May 26–28, 1999, pp. 303–306

(List continued on next page.)

Primary Examiner—Olik Chaudhuri
Assistant Examiner—Douglas A. Wille
(74) Attorney, Agent, or Firm—Myers Bigel Sibley & Sajovec

(57) ABSTRACT

Silicon carbide power devices having trench-based charge coupling regions include a silicon carbide substrate having a silicon carbide drift region of first conductivity type (e.g., N-type) and a trench therein at a first face thereof. A uniformly doped silicon carbide charge coupling region of second conductivity type (e.g., an in-situ doped epitaxial P-type region) is also provided in the trench. This charge coupling region forms a P-N rectifying junction with the drift region that extends along a sidewall of the trench. The drift region and charge coupling region are both uniformly doped at equivalent and relatively high net majority carrier doping concentrations (e.g., $1\times10^{17}$ cm$^{-3}$) so that both the drift region and charge coupling region can be depleted substantially uniformly when blocking reverse voltages. This combination of preferred drift and charge coupling regions improves the electric field profile in the drift region to such an extent that very low forward on-state drift region resistance can be achieved simultaneously with very high reverse blocking voltage capability. Silicon carbide switching devices that can advantageously use the preferred combination of drift and charge coupling regions include Schottky barrier rectifiers (SBRs), junction field effect transistors (JFETs) and metal-oxide-semiconductor field effect transistors (MOSFETs).

17 Claims, 15 Drawing Sheets

U.S. PATENT DOCUMENTS

| | | | |
|---|---|---|---|
| 5,216,275 | | 6/1993 | Chen .................................... 257/493 |
| 5,241,195 | * | 8/1993 | Tu et al. ............................... 257/155 |
| 5,264,713 | | 11/1993 | Palmour ................................. 257/77 |
| 5,318,915 | | 6/1994 | Baliga et al. ......................... 437/24 |
| 5,322,802 | | 6/1994 | Baliga et al. ......................... 437/22 |
| 5,323,040 | | 6/1994 | Baliga ................................. 257/332 |
| 5,338,945 | | 8/1994 | Baliga et al. ......................... 257/77 |
| 5,365,102 | | 11/1994 | Mehrotra et al. .................... 257/475 |
| 5,396,085 | | 3/1995 | Baliga ................................... 257/77 |
| 5,436,174 | | 7/1995 | Baliga et al. ......................... 437/22 |
| 5,438,215 | | 8/1995 | Tihanyi ................................ 257/401 |
| 5,471,075 | | 11/1995 | Shekar et al. ....................... 257/139 |
| 5,488,236 | | 1/1996 | Baliga et al. ........................ 257/132 |
| 5,493,134 | | 2/1996 | Mehrotra et al. ................... 257/132 |
| 5,539,238 | | 7/1996 | Malhi .................................. 257/510 |
| 5,543,637 | | 8/1996 | Baliga ................................... 257/77 |
| 5,612,547 | | 3/1997 | Clarke et al. ......................... 257/77 |
| 5,612,567 | | 3/1997 | Baliga ................................. 257/475 |
| 5,614,749 | | 3/1997 | Ueno ................................... 257/330 |
| 5,637,898 | | 6/1997 | Baliga ................................. 257/330 |
| 5,659,190 | | 8/1997 | Litwin .................................. 257/273 |
| 5,679,966 | | 10/1997 | Baliga et al. ........................ 257/139 |
| 5,681,762 | | 10/1997 | Baliga .................................. 437/22 |
| 5,686,737 | | 11/1997 | Allen .................................... 257/77 |
| 5,693,569 | | 12/1997 | Ueno ................................... 437/203 |
| 5,719,409 | | 2/1998 | Singh et al. ........................... 257/77 |
| 5,742,076 | | 4/1998 | Sridevan et al. ...................... 257/77 |
| 5,753,938 | | 5/1998 | Thapar et al. ......................... 257/77 |
| 5,831,288 | | 11/1998 | Singh et al. ........................... 257/77 |
| 5,852,314 | | 12/1998 | Depetro et al. ...................... 257/343 |
| 5,861,657 | | 1/1999 | Ranjan ................................ 257/492 |
| 5,932,897 | | 8/1999 | Kawaguchi et al. ................ 257/141 |
| 6,023,078 | * | 2/1900 | Baliga ................................. 257/122 |

OTHER PUBLICATIONS

Lee et al., "SOI High Voltage Integrated Circuit Technology for Plasma Display Panel Driver," The 11$^{th}$ International Symposium on Power Semiconductor Devices and IC's, Crowne Plaza, Toronto, Ontario, Canada, May 26–28, 1999, pp. 286–288.

Lorenz et al., "COOLMOS™—a new milestone in high voltage Power MOS," The 11$^{th}$ International Symposium on Power Semiconductor Devices and IC's, Crowne Plaza, Toronto, Ontario, Canada, May 26–28, 1999, pp. 3–10.

Nemoto et al., "The Recessed–Gate IGBT Structure," The 11$^{th}$ International Symposium on Power Semiconductor Devices and IC's, Crowne Plaza, Toronto, Ontario, Canada, May 26–28, 1999, pp. 149–152.

Peters et al. "Electrical performance of triple implanted vertical silicon carbide MOSFETs with low on–resistance," The 11$^{th}$ International Symposium on Power Semiconductor Devices and IC's, Crowne Plaza, Toronto, Ontario, Canada, May 26–28, 1999, pp. 103–106.

Schlögl et al., "Properties of CoolMOS$^{198}$ between 420K and 80K—The Ideal Device for Cryogenic Applications," The 11$^{th}$ International Symposium on Power Semiconductor Devices and IC's, Crowne Plaza, Toronto, Ontario, Canada, May 26–28, 1999, pp. 91–94.

Shenoy et al., "Analysis of the Effect of Charge Imbalance on the Static and Dynamic Characteristics of the Super Junction MOSFET," The 11$^{th}$ International Symposium on Power Semiconductor Devices and IC's, Crowne Plaza, Toronto, Ontario, Canada, May 26–28, 1999, pp. 99–102.

Trivedi et al., "Comparison of RF Performance of Vertical and Lateral DMOSFET," The 11$^{th}$ International Symposium on Power Semiconductor Devices and IC's, Crowne Plaza, Toronto, Ontario, Canada, May 26–28, 1999, pp. 245–248.

You et al., "A New Trench Bipolar Junction Diode (TBJD)," The 11$^{th}$ International Symposium on Power Semiconductor Devices and IC's, Crowne Plaza, Toronto, Ontario, Canada, May 26–28, 1999, pp. 133–136.

Zeng et al., "An Improved Power MOSFET Using a Novel Split Well Structure," The 11$^{th}$ International Symposium on Power Semiconductor Devices and IC's, Crowne Plaza, Toronto, Ontario, Canada, May 26–28, 1999, pp. 205–208.

Peter, *Power Semiconductors*, PCIM, Jan. 1999, pp. 24–32.

Lorenz et al., *Improved MOSFET: An Important Milestone Toward a New Power MOSFET Generation*, PCIM, Sep. 1998, pp. 14–22.

Deboy et al., *A New Generation of High Voltage MOSFETs Breaks the Limit Line of Silicon*, IEDM, 1998, pp. 683–685.

Fujihira et al., *Simulated Superior Performances of Semiconductor Superjunction Devices*, Proceedings of 1998 International Symposium on Power Semiconductor Devices & ICs, 1998, pp. 423–426.

Wahab et al., *A 3 kV Schottky Barrier Diode in 4H–SiC*, Appl. Phys. Lett., vol. 72, No. 4, Jan. 26, 1998, pp. 445–447.

Fujihira, *Theory of Semiconductor Superjunction Devices*, Jpn. J. Appl.. Phys., vol. 36, Pt. 1, No. 10, 1997, pp. 6254–6262.

Bhatnagar et al., *Comparison of 6H–Sic, and Si for Power Devices*, IEEE Transactions on Electron Devices, vol. 40, No. 3, Mar. 1993, pp. 645–655.

Bhatnagar et al., *Silicon–Carbide High–Voltage (400 V) Schottky Barrier Diodes*, IEEE Electron Device Letters, vol. 13, No. 10, Oct. 1992, pp. 501–503.

Appels et al., *High Voltage Thin Layer Devices (Resurf Devices)*, 1979 IEEE, pp. 238–241.

Parpia et al., *Optimization of RESURF LDMOS Transistors: An Analytical Approach*, IEEE Transactions on Electron Devices, vol. 37, No, 3, Mar. 1990, pp. 789–796.

Udrea et al., *A new class of lateral power devices for HVIC's based on the 3D RESURF concept*, Proceedings of the 1998 Bipolar/BiCMOS Circuits and Technology Meeting, Sep. 27–29, 1988, pp. 187–190.

Udrea et al., *The 3D RESURF junction*, 1998 International Semiconductor Conference, 21$^{st}$ Edition, Oct. 6–10, 1998, Sinaia, Romania, pp. 141–144.

Udrea et al., *3D RESURF double–gate MOSFET: A revolutionary power device concept*, Electronics Letters, Apr. 15, 1998, vol. 34, No. 8, pp. 808–809.

Lam et al., "Planar 6H–SIC Mesfet's with Vandium Implanted Channel Termination," IEEE Transactions on Electron Devices, vol. 44, No. 5, May 1997, pp. 907–910.

Itoh et al., "Excellent Reverse Blocking Characteristics of High–Voltage 4H–SIC Characteristics of High–Voltage 4H–SIC Schottky Rectifiers with Boron–Implanted Edge Termination," IEEE Electron Device Letters, vol. 17, No. 3, Mar. 1996, pp. 139–141.

International Search Report, PCT/US00/13455, Mar. 27, 2001.

Annex to Form PCT/ISA/206—Communication Relating to the Results of the Partial International Search, PCT/US00/13455, Sep. 19, 2000.

* cited by examiner

SILICON CARBIDE POWER DEVICES HAVING TRENCH-BASED SILICON CARBIDE CHARGE COUPLING REGIONS THEREIN

FIELD OF THE INVENTION

The present invention relates to semiconductor switching devices, and more particularly to silicon carbide switching devices for high power applications.

BACKGROUND OF THE INVENTION

Integrated circuit semiconductor devices typically include many active devices (e.g., rectifiers, transistors) in a single semiconductor substrate. Power semiconductor devices, which may be integrated circuit or discrete devices, are typically designed to carry large currents and/or support high voltages. Recently developed silicon power semiconductor devices are described in an article by G. Deboy et al. entitled "A New Generation of High Voltage MOSFETs Breaks the Limit Line of Silicon", International Electron Device Meeting (IEDM) Proceedings, pp. 683–685 (1998). In particular, the Deboy et al. article describes a 600 volt COOLMOS™ silicon device having an area specific on-resistance of typically 3.5 $\Omega mm^2$. In an attempt to overcome the tradeoff relationship between breakdown voltage and on-state resistance of conventional semiconductor devices, semiconductor superjunction (SJ) devices have also been proposed. Such devices are described in an article by T. Fujihira, entitled "Theory of Semiconductor Superjunction Devices", Japanese Journal of Applied Physics, Vol. 36, Part 1, No. 10, pp. 6254–6262 (1997).

Notwithstanding the excellent performance characteristics provided by state-of-the-art silicon power devices, silicon carbide power devices have also been considered because silicon carbide has a wide bandgap, a high melting point, a low dielectric constant, a high breakdown field strength, a high thermal conductivity and a high saturated electron drift velocity compared to silicon. These characteristics allow silicon carbide microelectronic devices to operate at higher temperatures and higher power levels than conventional silicon based devices. In addition to the above advantages, silicon carbide power devices can typically operate with lower specific on-resistance than conventional silicon power devices. Some of the advantages of using silicon carbide for forming power semiconductor devices are described in articles by K. Shenai, R.S. Scott and B. J. Baliga, entitled *Optimum Semiconductors for High-Power Electronics*, IEEE Transactions on Electron Devices, Vol. 36, No. 9, pp. 1811–1823 (1989); and by M. Bhatnagar and B. J. Baliga entitled *Analysis of Silicon Carbide Power Device Performance*, ISPSD '91, Abstr. 8.3, pp 176–180 (1991).

It has also been demonstrated experimentally that high voltage Schottky rectifiers can be made from silicon carbide, with low forward on-state voltage drop. Such rectifiers are described in articles by M. Bhatnagar et al., entitled "Silicon-Carbide High Voltage (400V) Schottky Barrier Diodes", IEEE Electronic Device Letters, Vol. 13, No. 10, pp. 501–503, (1992) and "Comparison of 6H-SiC, 3C-SiC, and Si for Power Devices" IEEE Trans. on Electron Devices, Vol. 40, No. 3, pp. 645–655 (1993). Unfortunately, such devices may suffer from unusually high leakage currents when operated in a reverse blocking mode, because of the occurrence of very high electric fields on the silicon carbide side of the Schottky rectifying junction. Excessive forward on-state series resistance may also be present in the silicon carbide drift regions of such devices when designed to block reverse voltages above 2,000 volts. For example, as described in an article by Q. Wahab et al. entitled "A 3 kV Schottky Barrier Diode in 4H-SiC", Applied Physics Letters, Vol. 72, No. 4, pp. 445–447, January (1998), a 4H-SiC Schottky rectifier designed to block voltages of 3,000 volts may experience a forward on-state voltage drop of 7.1 volts when forward on-state current densities of 100 A/cm² are present. These devices may also have insufficient thermal stability for many high power applications because the reverse leakage current in such devices typically increases rapidly with increasing reverse bias. To illustrate this problem, simulations have been performed on a one-dimensional 4H-SiC Schottky rectifier using an N-type drift region doping concentration of $5 \times 10^{15}$ cm$^{-3}$ land a drift region thickness of 25 μm. The results of one such simulation are illustrated by FIG. 1. In particular, FIG. 1 illustrates a typical triangular shaped electric field profile in the drift region with a maximum electric field at the Schottky rectifying contact. Because the magnitude of the electric field at the Schottky contact is high at about $2.4 \times 10^6$ V/cm at a reverse bias (RB) of 3,000 volts, the reverse leakage currents will typically become excessive due to barrier lowering and field emission effects.

In silicon Schottky rectifiers, it has been shown that a combination of a trench-based insulated anode electrode and a graded doping profile can produce Schottky rectifiers having superior forward and reverse characteristics. Such devices are described in U.S. Pat. No. 5,612,567 to B. Jayant Baliga, entitled "Schottky Barrier Rectifiers and Methods of Forming Same" and in U.S. application Ser. No. 09/167,298, filed Oct. 6, 1998, entitled "Rugged Schottky Barrier Rectifiers Having Improved Avalanche Breakdown Characteristics", now abandoned, the disclosures of which are hereby incorporated herein by reference. However, the use of a trench-based anode electrode typically cannot be extended to a silicon carbide device because the magnitude of the electric field in the insulating region (e.g., oxide) lining the trench may become excessive and exceed the rupture strength of the insulator, which for silicon dioxide is $1 \times 10^7$ V/cm. Simulations of silicon carbide Schottky rectifiers having the structure illustrated by the aforementioned '567 patent reveal that when blocking reverse voltages, almost all of the reverse bias voltage will appear across the insulating region. If the insulating region comprises silicon dioxide, the maximum reverse blocking voltages for such devices may be limited to only 200 volts.

Thus, notwithstanding the above-described power semiconductor devices, there continues to be a need for improved power semiconductor devices that utilize the preferred material characteristics of silicon carbide more advantageously.

SUMMARY OF THE INVENTION

It is therefore an object of the present invention to provide improved semiconductor switching devices for high power applications.

It is another object of the present invention to provide semiconductor switching devices having low on-state resistance and high blocking voltage capability.

It is still another object of the present invention to provide power semiconductor devices having improved ruggedness.

These and other objects, advantages and features of the present invention are provided by silicon carbide switching devices that comprise a silicon carbide substrate having a silicon carbide drift region of first conductivity type (e.g., N-type) and a trench therein at a first face thereof. A uniformly doped silicon carbide charge coupling region of second conductivity type (e.g., an in-situ doped epitaxial P-type region) is also provided in the trench. This charge coupling region forms a P-N rectifying junction with the drift region that extends along a sidewall of the trench. According to a preferred aspect of the present invention, the drift region and charge coupling region are both uniformly doped at equivalent and relatively high net majority carrier doping concentrations (e.g., $1 \times 10^{17}$ cm$^{-3}$) so that both the drift region and charge coupling region can be depleted substantially uniformly when blocking reverse voltages. This combination of preferred drift and charge coupling regions improves the electric field profile in the drift region to such an extent that very low forward on-state drift region resistance can be achieved simultaneously with very high reverse blocking voltage capability. Silicon carbide switching devices that can advantageously use the preferred combination of drift and charge coupling regions include Schottky barrier rectifiers (SBRs), junction field effect transistors (JFETs) and metal-oxide-semiconductor field effect transistors (MOSFETs).

According to a preferred embodiment of a Schottky barrier rectifier, a highly doped contact region of second conductivity type (e.g., P+) is provided at a top of the trench and a lightly doped contact region of first conductivity type (e.g., N−) is provided at a top of the drift region. An anode electrode, which forms a Schottky rectifying junction with the lightly doped contact region and an ohmic contact to the highly doped contact region, is also provided on the first face of the substrate. These contact regions act to reduce the magnitude of the electric fields established on the substrate side of the Schottky rectifying junction (i.e., underneath the Schottky rectifying contact), and thereby reduce reverse leakage current. These contact regions also act to protect the Schottky rectifying junction from avalanche breakdown failure by diverting avalanche breakdown current to the P-N junction formed between the charge coupling region and the drift region.

In the preferred Schottky rectifier, the concentration of majority carrier dopants in the silicon carbide charge coupling region is in a range between about $5 \times 10^{16}$ cm$^{-3}$ and $5 \times 10^{17}$ cm$^{-3}$ and the concentration of majority carrier dopants in the silicon carbide drift region is also in a range between about $5 \times 10^{16}$ cm$^{-3}$ and $5 \times 10^{17}$ cm$^{-3}$. In particular, the concentrations of majority carrier dopants are preferably selected so that the compensated (i.e., net) first conductivity type doping concentration in the drift region equals the compensated second conductivity type doping concentration in the charge coupling region. A relatively lightly doped first silicon carbide contact region of first conductivity type, which extends from the silicon carbide drift region to the Schottky rectifying junction, has a majority carrier doping concentration therein of less than $5 \times 10^{16}$ cm$^{-3}$ and a relatively highly doped second silicon carbide contact region of second conductivity type, which extends from the silicon carbide charge coupling region to the ohmic contact, has a majority carrier doping concentration therein of greater than $5 \times 10^{17}$ cm$^{-3}$. A silicon carbide cathode region of first conductivity type and a cathode contact are also provided. The silicon carbide cathode region extends adjacent a second face of the silicon carbide substrate, has a majority carrier doping concentration therein of greater than $5 \times 10^{17}$ cm$^{-3}$ and forms a non-rectifying junction with the silicon carbide drift region.

According to a preferred embodiment of a vertical UMOSFET, an insulated gate electrode is provided in the trench and the silicon carbide charge coupling region is positioned to extend between the insulated gate electrode and a bottom of the trench. In this embodiment, the trench-based silicon carbide charge coupling region acts to improve the electric field profile in the drift region and enables the MOSFET to support high voltages with extremely low on-state resistance (well below the ideal specific on-state resistance). A silicon carbide base region of second conductivity type is also provided in the substrate, adjacent the trench. In particular, the base region extends to the sidewall of the trench and forms a P-N rectifying junction and a nonrectifying junction with the silicon carbide drift region and the silicon carbide charge coupling region, respectively. Like the Schottky rectifier, the net concentration of majority carrier dopants in the silicon carbide charge coupling region is in a range between about $5 \times 10^{16}$ cm$^{-3}$ and $5 \times 10^{17}$ and the net concentration of majority carrier dopants in the silicon carbide drift region is in a range between about $5 \times 10^{16}$ cm$^{-3}$ and $5 \times 10^{17}$.

According to a preferred embodiment of a vertical junction JFET, the silicon carbide charge coupling region in the trench serves as a gate region which controls the conductivity of the uniformly doped drift region. A highly doped silicon carbide source region of first conductivity type is also provided at the top of the drift region. In addition, a silicon carbide channel region of first conductivity type is provided. This channel region extends between the silicon carbide source region and the silicon carbide drift region. The silicon carbide channel region preferably has a majority carrier doping concentration therein of less than $5 \times 10^{16}$ cm$^{-3}$. A relatively highly doped silicon carbide gate region of second conductivity type is also provided. This gate region forms a non-rectifying junction with the silicon carbide charge coupling region at the top of the trench and has a majority carrier doping concentration therein of greater than $5 \times 10^{17}$ cm$^{-3}$. This combination of the highly doped gate region and lightly doped channel region improves the pinch off characteristics and the DC and AC blocking voltage gain of the JFET device.

To provide more efficient and uniform charge coupling, silicon carbide power devices are also provided comprising a silicon carbide substrate having a uniformly doped silicon carbide drift region of first conductivity type therein and first and second trenches having widths $WT_1$ and $W_{T2}$, respectively, in the uniformly doped silicon carbide drift region. According to this embodiment of the present invention, the first and second trenches define a silicon carbide drift region mesa therebetween having a width $W_M$ and a first conductivity type doping concentration $N_{DM}$ therein. First and second uniformly doped silicon carbide charge coupling regions of second conductivity type are also provided in the first and second trenches, respectively. The first uniformly doped silicon carbide charge coupling region forms a first P-N rectifying junction with the silicon carbide drift region mesa along a sidewall of said first trench and the second uniformly doped silicon carbide charge coupling region forms a second P-N rectifying junction with the silicon carbide drift region mesa along a sidewall of the second trench. Moreover, to provide optimum charge coupling and thereby improve the high blocking voltage capability of the power device, the second conductivity type doping concentrations in the first and second silicon carbide charge coupling regions equal $N_{CC1}$ and $N_{CC2}$, respectively, and the following relationships are satisfied: $0.5 \times 10^{13}$ cm$^{-2} \leq (N_{DM})(W_M) \leq 5.0 \times 10^{13}$ cm$^{-2}$ and $(N_{DM})(W_M) = \frac{1}{2}(N_{CC1})(W_{T1}) + \frac{1}{2}(N_{CC2})(W_{T2})$.

These power devices may include Schottky rectifiers. To reduce reverse leakage currents, such rectifiers may include a first silicon carbide contact region of first conductivity type (e.g., N−) on the silicon carbide drift region mesa. This first silicon carbide contact region has a net majority carrier doping concentration therein of less than $5 \times 10^{16}$ cm$^{-3}$ and a Schottky rectifying contact is provided in contact with the first silicon carbide contact region. To provide additional protection to the Schottky contact against avalanche breakdown failure, second silicon carbide contact regions of second conductivity type (e.g., P+) is provided at a top of the trenches. The second silicon carbide contact regions are relatively highly doped and have a net majority carrier doping concentration therein of greater than $5 \times 10^{17}$ cm$^{-3}$. These contact regions also form respective nonrectifying junctions with the uniformly doped silicon carbide charge coupling regions in the trenches. The power devices may also include enhanced UMOSFETs having silicon carbide charge coupling regions that are disposed at the bottoms of the trenches, underneath the respective trench-based gate electrodes.

According to another embodiment of the present invention, a silicon carbide power device is provided which utilizes a trench-based semi-insulating region to improve reverse blocking voltage capability. Such devices preferably include a silicon carbide substrate having first and second faces and a silicon carbide drift region of first conductivity type therein. A trench is also provided in the silicon carbide substrate and a semi-insulating region, having a resistivity in a range between $10^{14}$–$10^{18}$ Ωcm, is provided in the trench. This semi-insulating region is electrically connected to the silicon carbide drift region at a sidewall thereof. An electrode is also provided on the first face of the silicon carbide substrate. This electrode is electrically coupled to the semi-insulating region in the trench and may also form a Schottky rectifying junction with the silicon carbide drift region. According to preferred aspects of this embodiment, the silicon carbide drift region has a graded first conductivity type doping concentration therein and the semi-insulating region comprises oxygen-doped polysilicon. A silicon carbide UMOSFET may also be provided with a semi-insulating region therein. In particular, a semi-insulating region having a resistivity in a range between $10^{14}$–$10^{18}$ Ωcm may be provided in a trench of the UMOSFET. This semi-insulating region preferably extends between the insulated gate electrode and a bottom of the trench.

DESCRIPTION OF PREFERRED EMBODIMENTS

Figure 1:
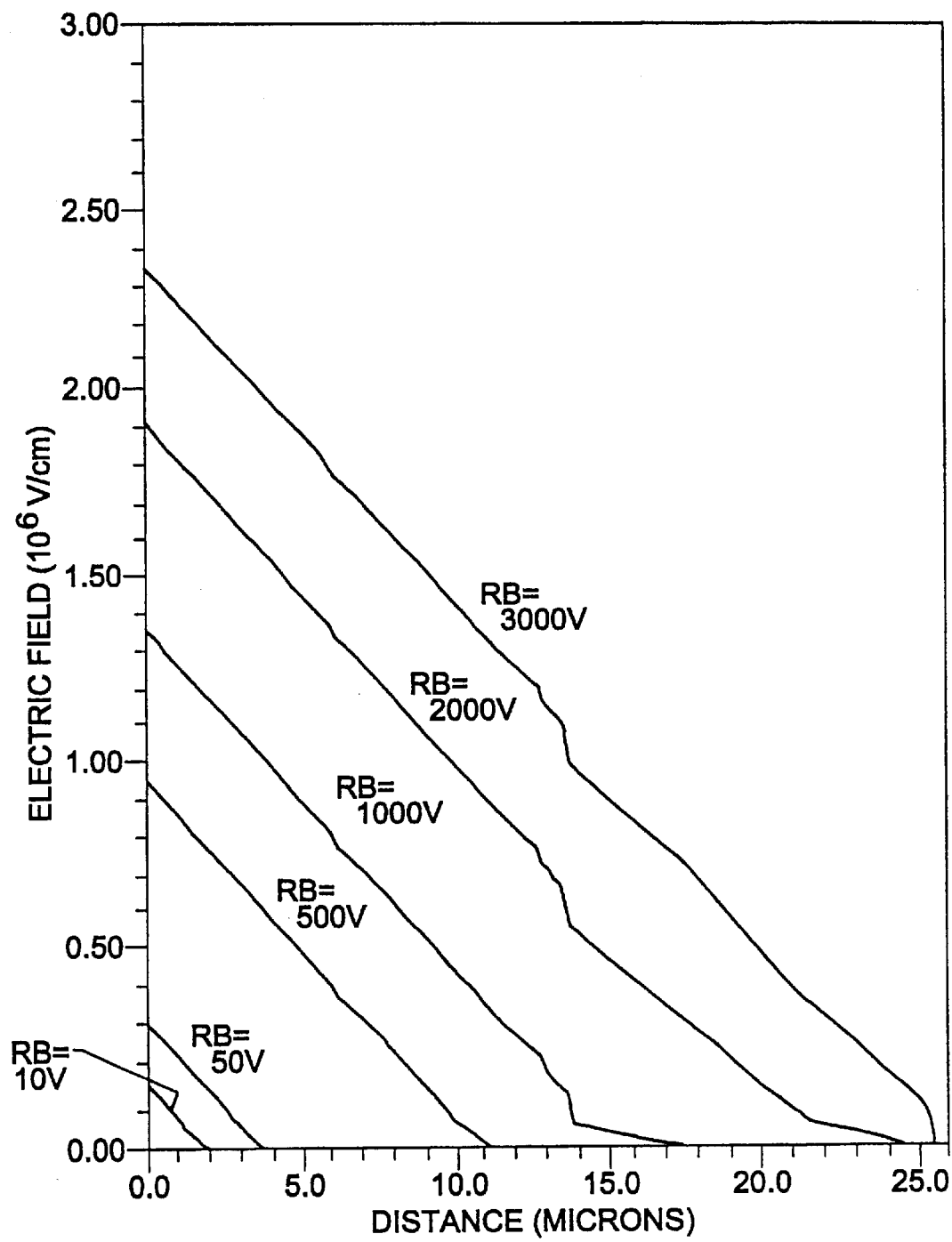
FIG. 1 is a graph that illustrates the simulated electric field profile in a planar silicon carbide Schottky barrier rectifier having a drift region doping concentration of $5 \times 10^{15}$ cm$^{-3}$ and a drift region thickness of 25 μm. The graph's y-axis specifies the magnitude of the electric field, the x-axis specifies the distance into the drift region (relative to the Schottky contact interface) and the abbreviation "RB" designates the magnitude of the reverse bias ranging from 10 volts to 3,000 volts.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 2:
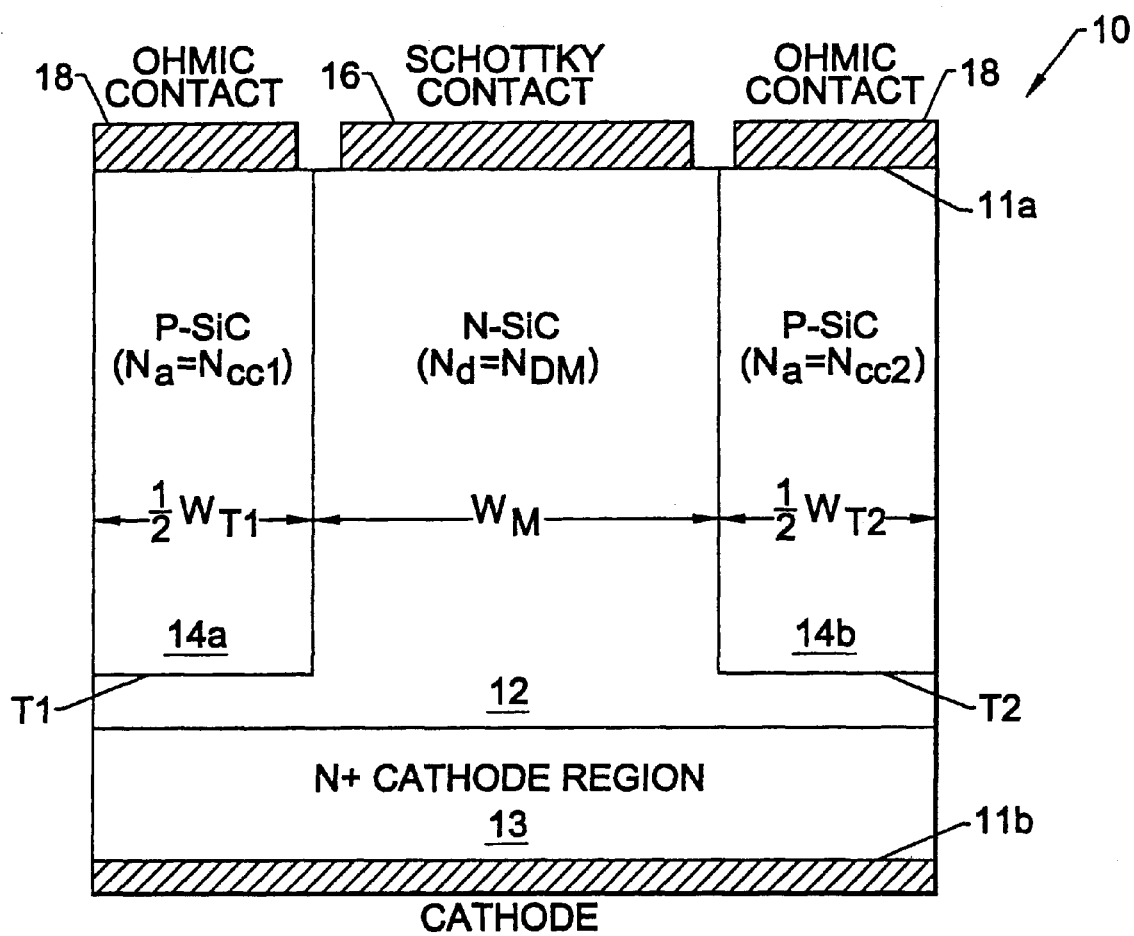
FIG. 2 is a cross-sectional view of a silicon carbide Schottky rectifier according to a first embodiment of the present invention.

Referring now to FIG. 2, a preferred silicon carbide Schottky rectifier 10 according to a first embodiment of the present invention will be described. As illustrated, this preferred Schottky rectifier 10 comprises a silicon carbide substrate having first and second opposing faces 11a and 11b thereon and a highly doped cathode region 13 therein. The silicon carbide substrate also has a uniformly doped silicon carbide drift region 12 of first conductivity type (e.g., N-type) therein. First and second trenches T1 and T2 having widths $W_{T1}$ and $W_{T2}$, respectively, are also provided in the uniformly doped silicon carbide drift region 12. As illustrated, the first and second trenches define a silicon carbide drift region mesa therebetween having a width $W_M$ and a first conductivity type doping concentration $N_{DM}$ therein. First and second uniformly doped silicon carbide charge coupling regions 14a and 14b of second conductivity type (e.g., P-type) are also provided in the first and second trenches, respectively. The first uniformly doped silicon carbide charge coupling region 14a forms a first P-N rectifying junction with the silicon carbide drift region 12 along a sidewall and bottom of the first trench and the second uniformly doped silicon carbide charge coupling region 14b forms a second P-N rectifying junction with the silicon carbide drift region 12 along a sidewall and bottom of the second trench. These silicon carbide charge coupling regions 14a and 14b of a unit cell device are preferably formed using epitaxial growth and in-situ doping techniques.

A Schottky rectifying contact 16 is also provided on the silicon carbide drift region mesa and forms a Schottky rectifying junction therewith at the first face 11a. The same layer of metallization (e.g., aluminum) used to form the Schottky rectifying contact 16 may also be used to form an ohmic contact 18 on the first and second silicon carbide charge coupling regions 14a and 14b. Alternatively, a first layer of metallization (e.g., nickel, titanium) may be deposited and patterned to define the Schottky rectifying contact 16 and a second layer of metallization (e.g., aluminum) may be deposited as a blanket layer on the silicon carbide charge coupling regions and on the Schottky rectifying contact 16.

According to preferred aspects of this embodiment of the present invention, the second conductivity type doping concentrations in the first and second silicon carbide charge coupling regions equal $N_{CC1}$ and $N_{CC2}$, respectively. To provide improved charge coupling, these doping concentrations are selected to satisfy the following relationship:

$$\frac{1}{2}(N_{CC1})(W_{T1}) + \frac{1}{2}(N_{CC2})(W_{T2}) = (N_{DM})(W_M) \quad (1)$$

where the product (NDM)(WM) is designed to be within a predetermined range:

$$0.5 \times 10^{13} \text{ cm}^{-2} \leq (N_{DM})(W_M) \leq 5.0 \times 10^{13} \text{ cm}^{-2} \quad (2)$$

Figure 3:
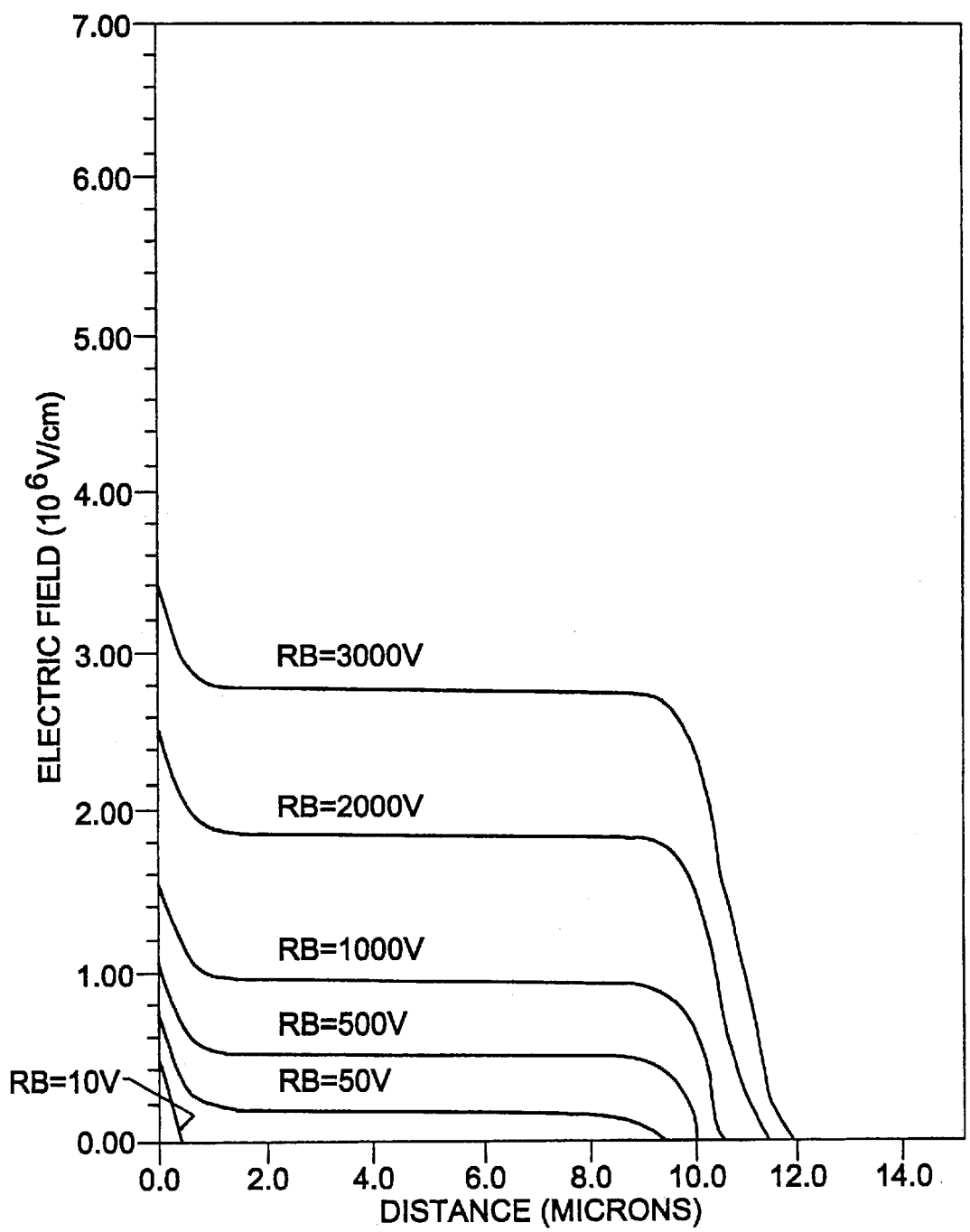
FIG. 3 is a graph that illustrates the simulated electric field profile in a Schottky rectifier according to the embodiment of FIG. 2. The graph's y-axis specifies the magnitude of the electric field, the x-axis specifies the distance into the uniformly doped drift region mesa (relative to the Schottky contact interface).
Figure 4:
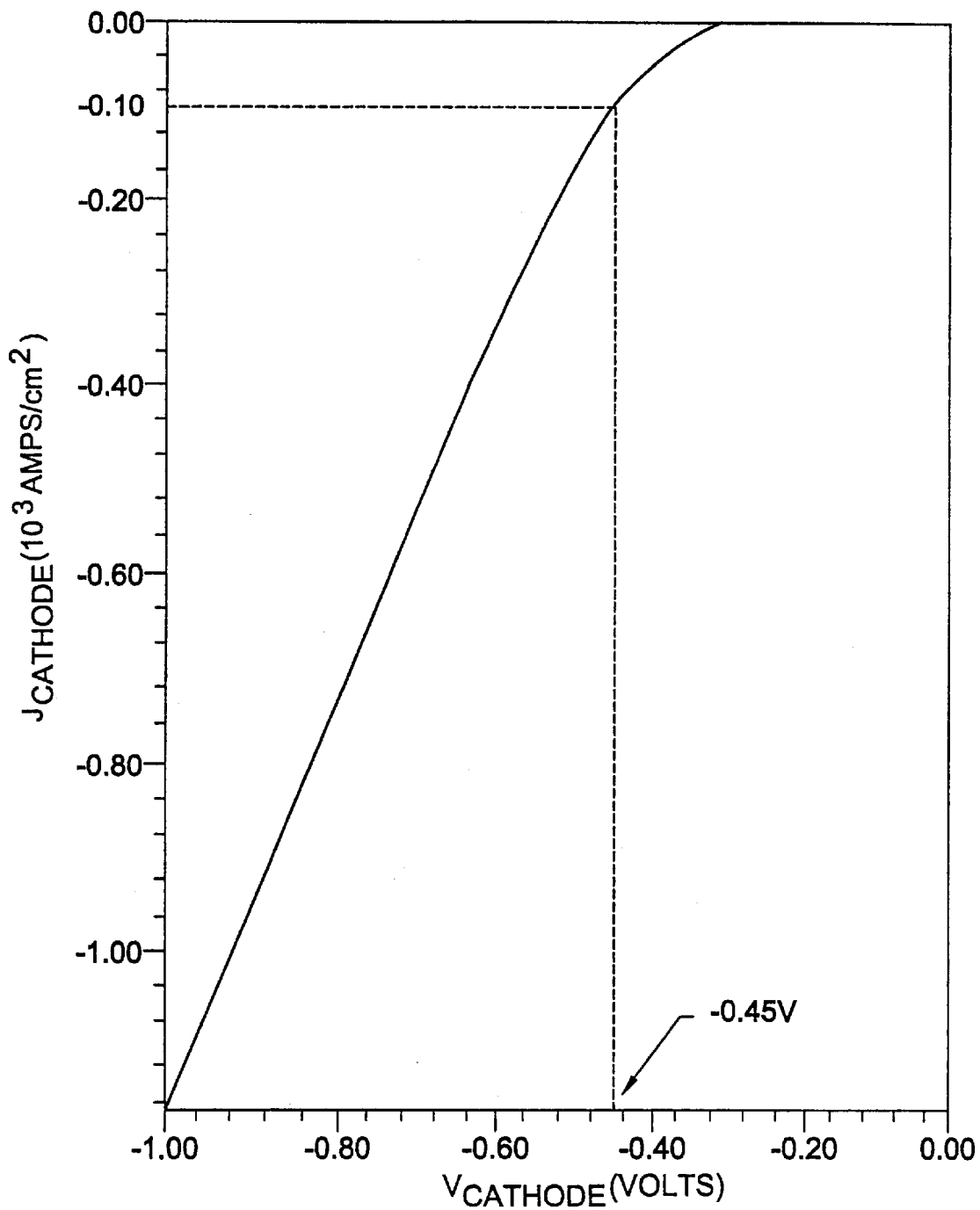
FIG. 4 is a graph that illustrates the forward on-state I–V characteristics of a Schottky rectifier according to the embodiment of FIG. 2, at a temperature of 393K.

As described more fully hereinbelow with respect to FIGS. 3–4, the combination of the silicon carbide charge coupling regions in the trenches and a uniformly doped silicon carbide drift region mesa improve the electric field profile in the drift region mesa and simultaneously provide a very low drift region resistance for a rectifier having very high blocking voltage capability. The above described relationships are preferably satisfied at every level (e.g., depth) in the drift region mesa. Accordingly, variations in doping concentrations may need to be established in the drift region mesa and in the charge coupling regions to account for trenches having nonuniform widths. As will be understood by those skilled in the art, the sidewalls of the trenches are generally tapered outward as a result of processing conditions (e.g., nonuniform etching of the substrate). To account for the fact that the trenches are typically wider at the top than at the bottom, the doping concentrations in the charge coupling regions may be tailored in a vertical direction so that the relationships of equations (1) and (2) are maintained at every level.

Numerical simulations were performed to illustrate the operation of the device of FIG. 2. For these simulations, the doping concentrations in the drift region mesa and charge coupling regions were set at $1 \times 10^{17}$ cm$^{-3}$ and the trench depth was set to 10 microns. The trench and mesa widths were set at 1 micron. Based on simulation, the breakdown voltage for the device of FIG. 2 was determined to be 2650 volts. As illustrated by FIG. 3, the simulated electric field profiles in the drift region mesa indicate an excellent constant electric field over most of the drift region mesa when compared with the triangular electric field distribution illustrated by FIG. 1. Moreover, as illustrated by FIG. 4, the onstate voltage drop was extremely small at a level of 0.45 volts (at an on-state current density of 100 A/cm$^2$ and temperature of 393K). However, the magnitude of the electric field at the Schottky contact was still relatively high at a level of $3.4 \times 10^6$ V/cm (at a reverse bias of 3000 volts).

Figure 5:
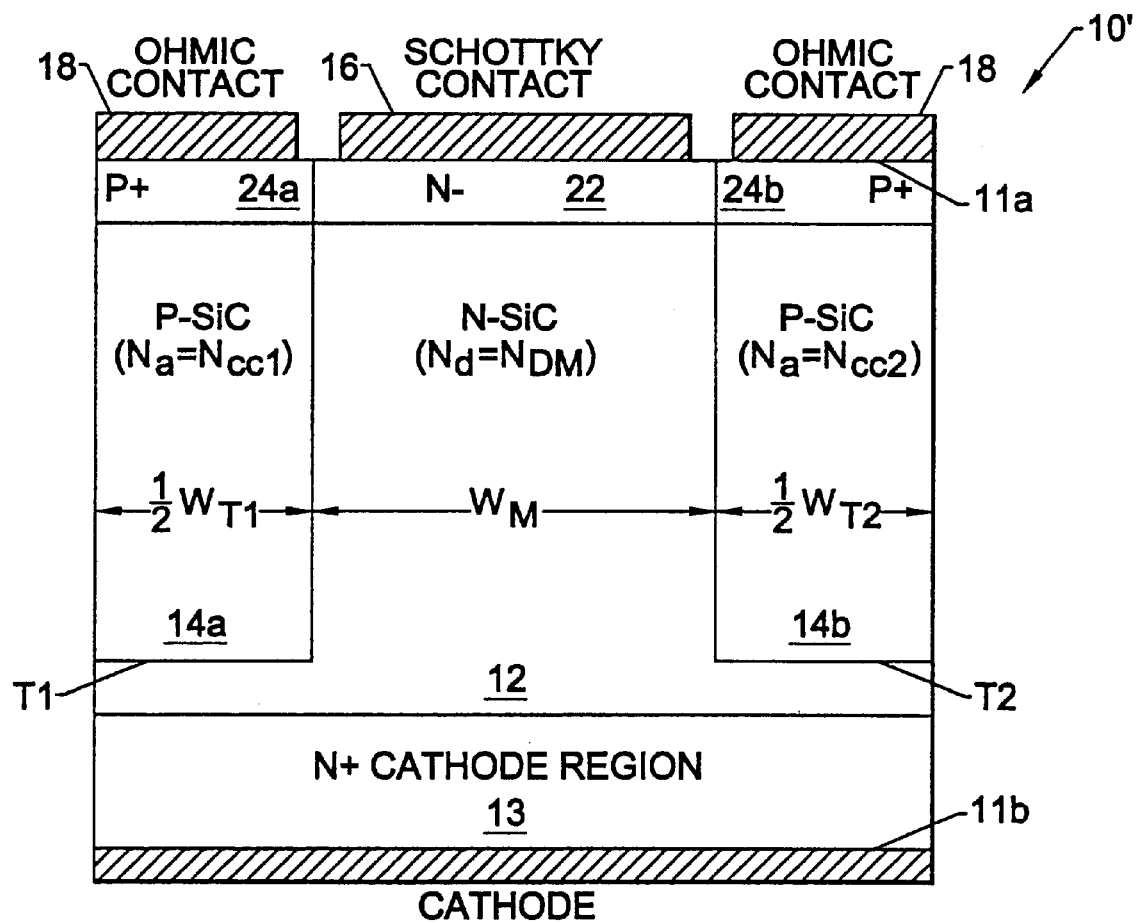
FIG. 5 is a cross-sectional view of a silicon carbide Schottky rectifier according to a second embodiment of the present invention.

An improved version of the Schottky rectifier of FIG. 2 is illustrated by FIG. 5. In particular, the Schottky rectifier 10' of FIG. 5 is similar to the rectifier 10 of FIG. 2, however, the improved rectifier 10' includes a relatively lightly doped first silicon carbide contact region 22 of first conductivity type (shown as N−) on the silicon carbide drift region mesa. The first silicon carbide contact region 22 forms a nonrectifying junction with the drift region mesa and preferably has net majority carrier doping concentration therein of less than $5 \times 10^{16}$ cm$^{-3}$. As illustrated, the Schottky rectifying contact 16 forms a Schottky rectifying junction with the first silicon carbide contact region 22. This second embodiment also includes relatively highly doped second silicon carbide contact regions 24a and 24b of second conductivity type (shown as P+) in the trenches. These second silicon carbide contact regions 24a and 24b have net majority carrier doping concentrations therein of greater than $5 \times 10^{17}$ cm$^{-3}$ and form nonrectifying junctions with the uniformly doped silicon carbide charge coupling regions 14a and 14b.

Figure 6:
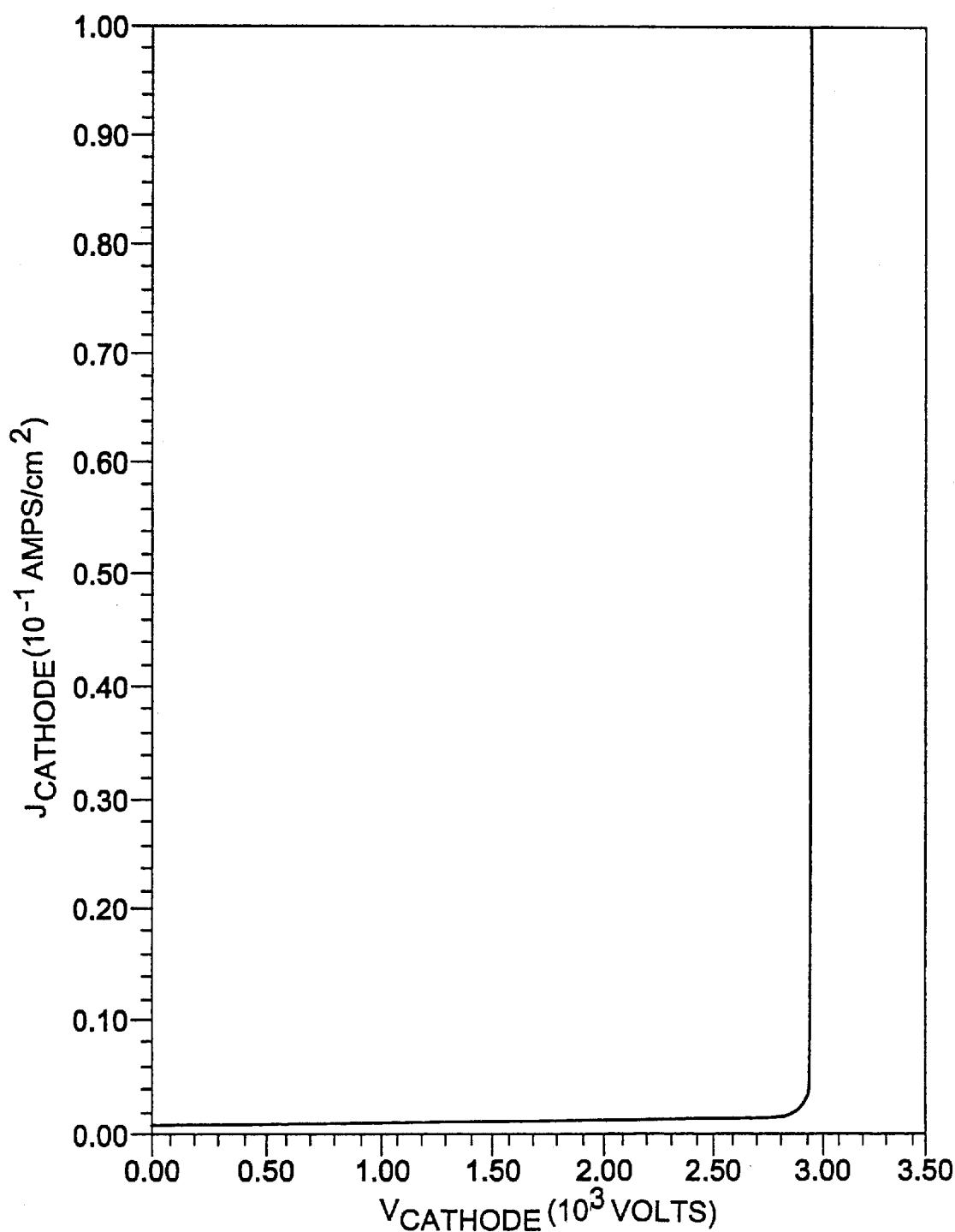
FIG. 6 is a graph that illustrates reverse-voltage blocking characteristics for the Schottky rectifier of FIG. 5 at a temperature of 393K.
Figure 7:
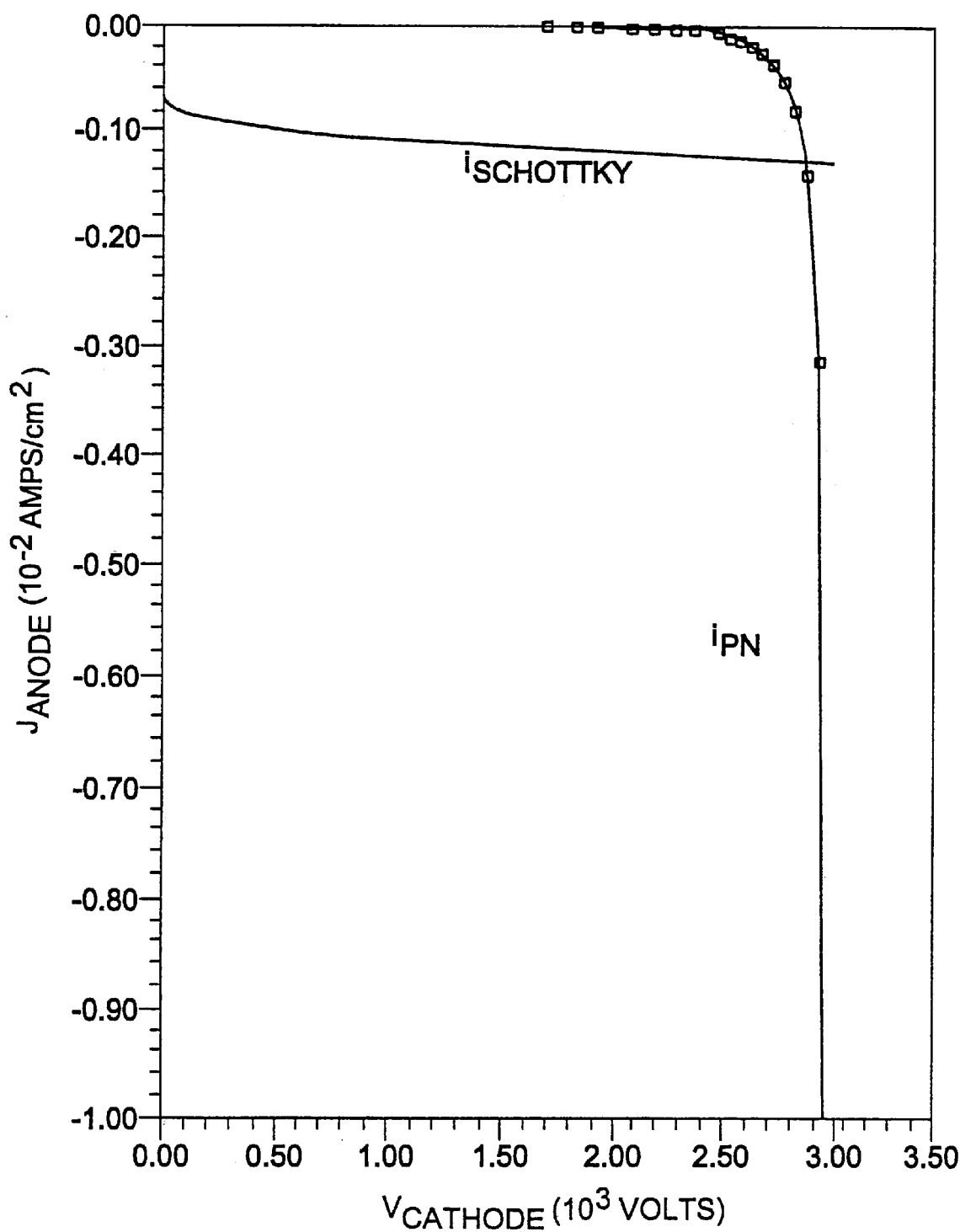
FIG. 7 is a graph that illustrates reverse I–V characteristics for the Schottky rectifier of FIG. 5, where $i_{schottky}$ and $i_{PN}$ designate the reverse leakage currents through the Schottky rectifying junction and the P-N junction formed between the charge coupling region and the drift region.
Figure 8:
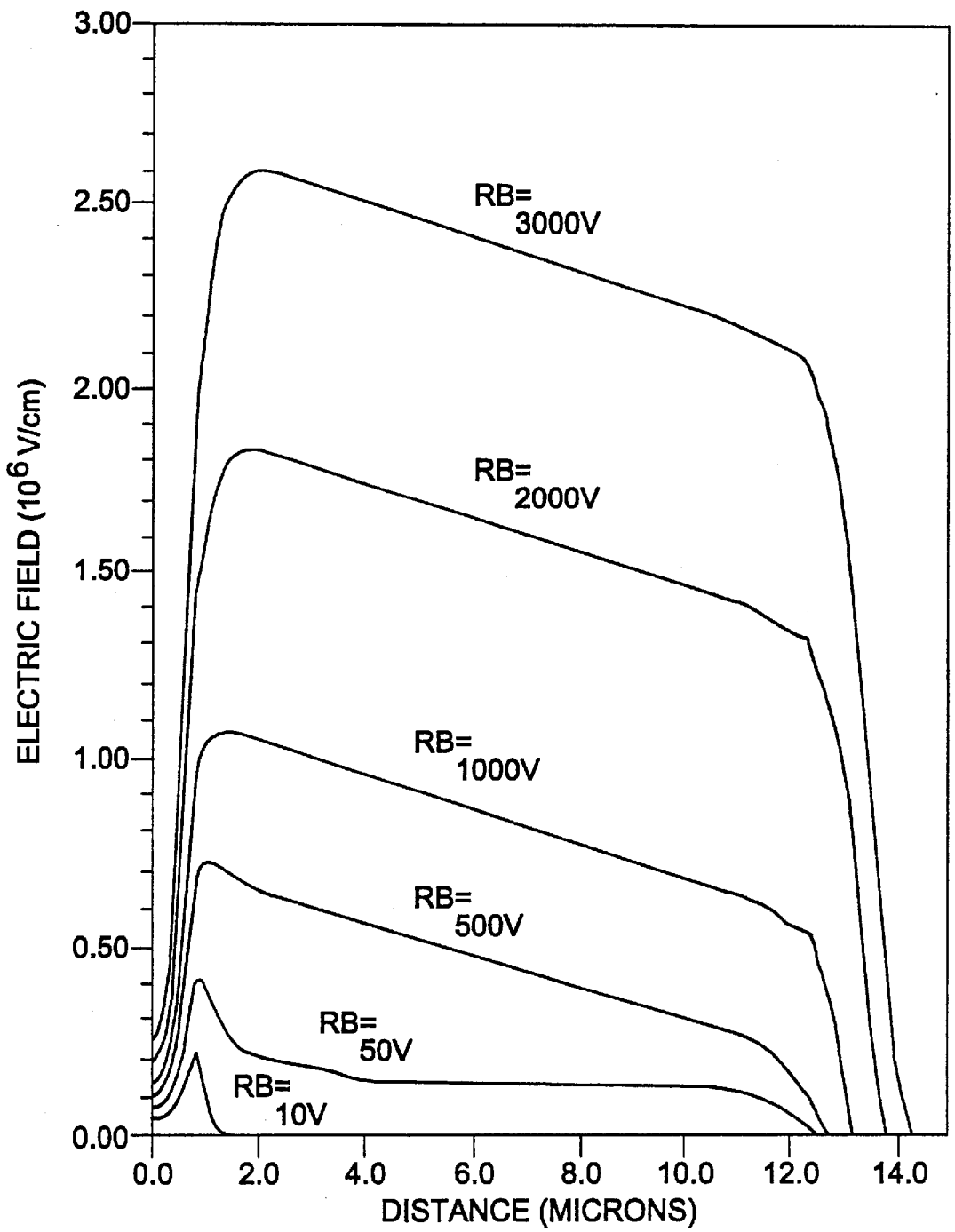
FIG. 8 is a graph that illustrates a simulated electric field profile in a Schottky rectifier according to the embodiment of FIG. 5. The graph's y-axis specifies the magnitude of the electric field and the x-axis specifies the distance into the uniformly doped drift region mesa (relative to the Schottky contact interface).
Figure 9:
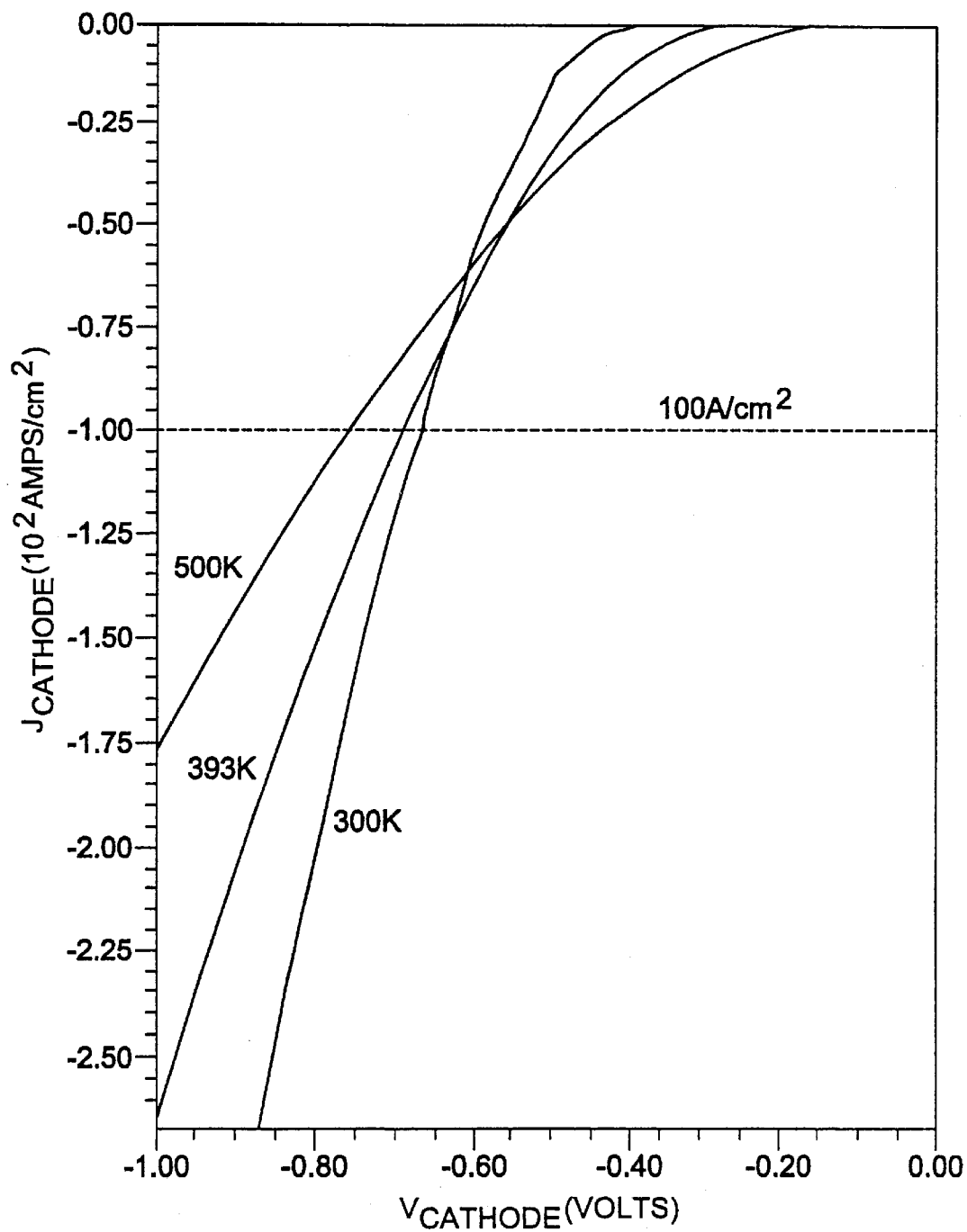
FIG. 9 is a graph that illustrates the forward on-state I–V characteristics of a Schottky rectifier according to the embodiment of FIG. 5, at temperatures of 300K, 393K and 500K.

Numerical simulations of the device of FIG. 5 illustrate that an improvement in reverse leakage current can be achieved by suppressing the electric field at the Schottky rectifying junction. In particular, simulations on the unit cell device of FIG. 5 were performed using the parameters described above with respect to FIGS. 3–4. In addition, the first silicon carbide contact region 22 was specified to have a thickness of 1 micron and the N-type doping concentration in this region was set at $1 \times 10^{16}$ cm$^{-3}$. The second silicon carbide contact regions 24a and 24b were specified to have a thickness of 1 micron as well, and the P-type doping concentrations in these regions were set at $1 \times 10^{19}$ cm$^{-3}$. Trench depths of 13 microns were also used. As illustrated by FIG. 6, based on simulation, the breakdown voltage for the device of FIG. 5 was determined to be higher at 3000 volts. The reverse current flow through the Schottky rectifying junction and through the P-N junction (between a charge coupling region and the drift region) is illustrated by FIG. 7. It can be seen from FIG. 7 that after avalanche breakdown, almost all of the current flows through the P-N junction. Thus, substantial protection can be provided to the Schottky rectifying junction. The electric field profiles of FIG. 8 also indicate an excellent and substantially uniform electric field distribution over most of the drift region mesa. Further, in contrast to FIG. 3, the magnitude of the electric field at the Schottky rectifying contact 16 ($0.25 \times 10^6$ V/cm at 3000 volts reverse bias) is much lower than the maximum electric field in the drift region mesa ($2.6 \times 10^6$ V/cm at 3000 volts reverse bias). As illustrated by FIG. 9, the on-state voltage drop at a current density of 100 A/cm$^2$ and temperature of 300K was extremely small at a level of 0.67 volts.

According to a third embodiment of the present invention, the uniformly doped silicon carbide drift region mesa and the first silicon carbide contact region 22 of FIG. 5 may be replaced by a single silicon carbide drift region having a graded doping profile therein. The grading of the doping profile in the drift region may be as disclosed in U.S. Pat. No. 5,612,567 to Baliga, entitled "Schottky Barrier Rectifiers and Methods of Forming Same" assigned to the present assignee, the disclosure of which is hereby incorporated herein by reference. In this third embodiment, the uniformly doped silicon carbide charge coupling regions of second conductivity type in the trenches are replaced by semi-insulating (high resistivity) regions having a resistivity in a range between $10_{14}$–$10_{18}$ Ωcm. These semi-insulating regions may comprise vanadium doped silicon carbide or semi-insulating polysilicon doped with oxygen. The function of the semi-insulating regions in combination with the graded doping profile is to improve the electric field distribution under the Schottky contact 16. The highly doped P+ region at the top of the semi-insulating region also acts to suppress the electric field underneath the Schottky contact. Because of the high resistivity of the semi-insulating regions, the electrical connection between the metallization used to form the Schottky contact and the semi-insulating regions need not be ohmic.

Figure 14:
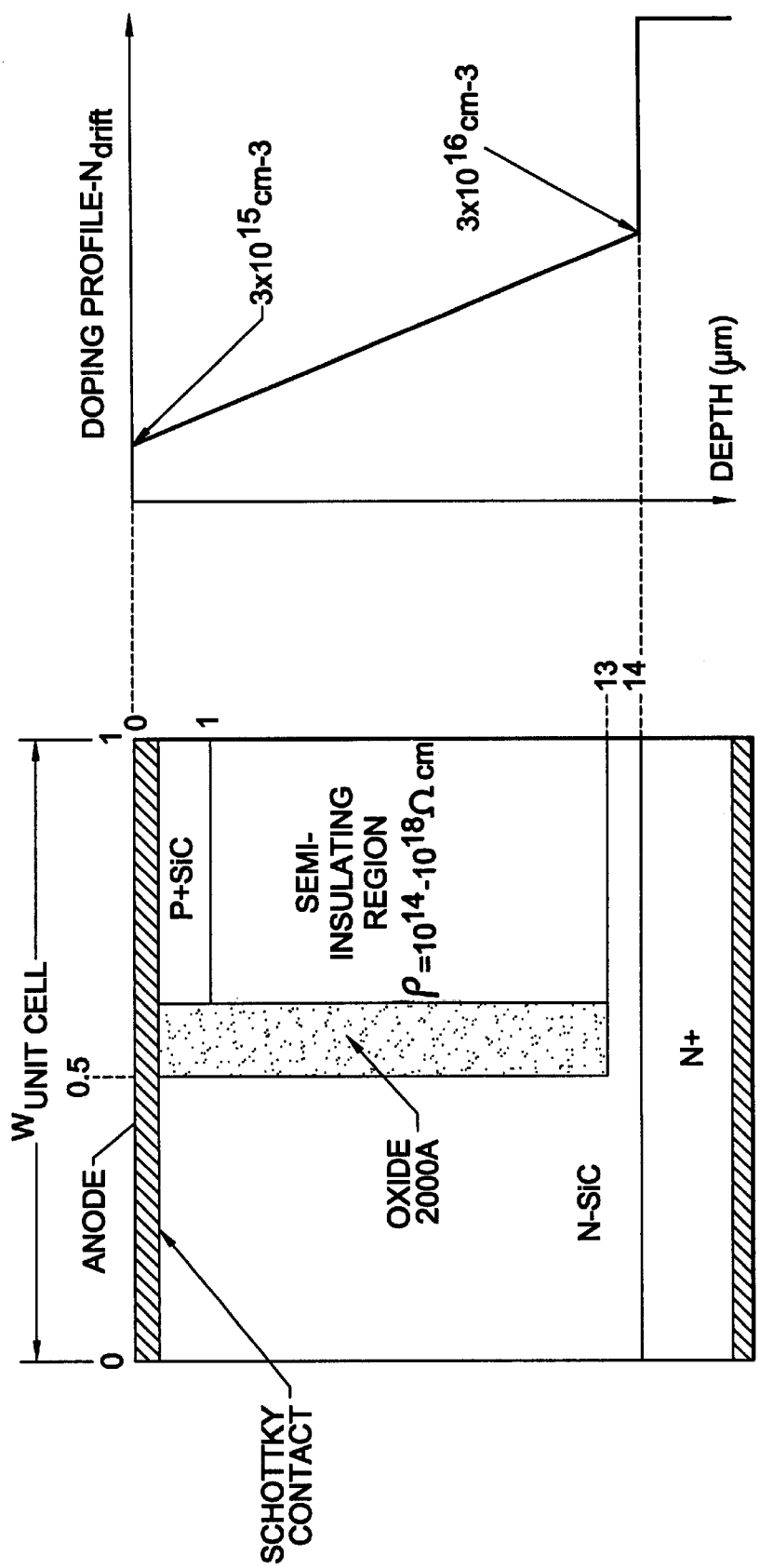
FIG. 14 is a cross-sectional view of a silicon carbide Schottky rectifier according to a third embodiment of the present invention.
Figure 15:
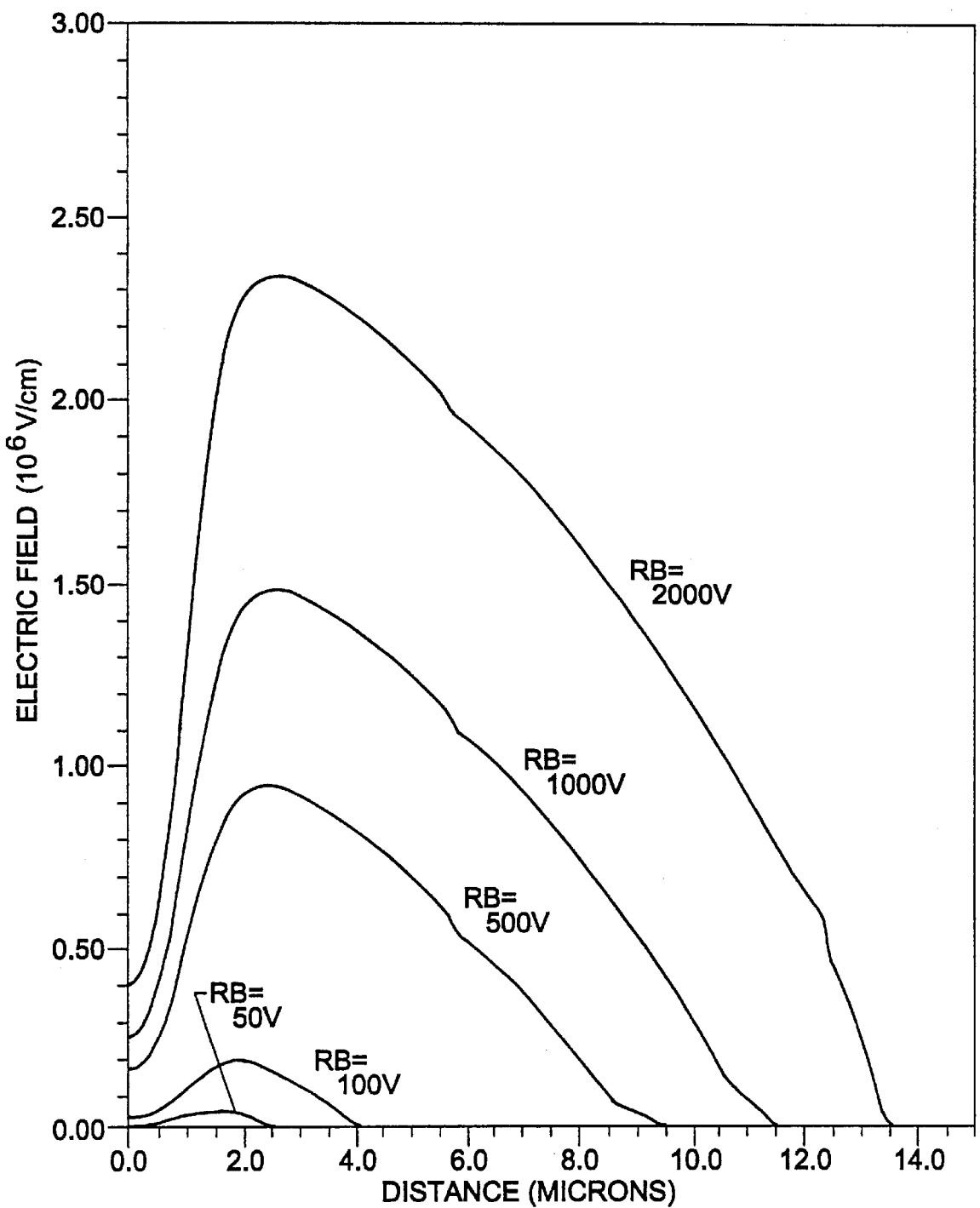
FIG. 15 is a graph that illustrates a simulated electric field profile in a Schottky rectifier according to the embodiment of FIG. 14. The graph's y-axis specifies the magnitude of the electric field and the x-axis specifies the distance into the nonuniformly doped drift region mesa (relative to the Schottky contact interface).

Numerical simulations of the third embodiment were performed. In these simulations of a unit cell device, the drift region had a linearly graded doping profile that increased from a level of $3 \times 10^{15}$ cm$^{-3}$ at the Schottky contact to a level of $3 \times 10^{16}$ cm$^{-3}$ at the junction with the cathode region 13 (at a linear gradient of $2 \times 10^{19}$ cm$^{-4}$). A trench depth of 13 microns was also used. The semi-insulating region in the trench was modeled as an N-type silicon carbide region having a net first conductivity type doping concentration therein of $1 \times 10^1$ cm$^{-3}$ which corresponds to a resistivity of about $10^{14}$ Ωcm. Based on these parameters, the breakdown voltage of the Schottky rectifier according to the third embodiment was determined to be 2470 volts. The electric field at the Schottky contact was relatively large at a level of $2.5 \times 10^6$ V/cm at a reverse bias of 2000 volts. The addition of a 1 micron thick highly doped P+ region at the top of the semi-insulating region was also found to suppress the electric field at the Schottky contact to a level of $0.4 \times 10^6$ V/cm at a reverse bias of 2000 volts. The addition of the P+ region also increased the reverse breakdown voltage to 2600 volts. The on-state voltage drop at a current density of 100 A/cm$^2$ was also found to be 0.86 volts at room temperature (300K). According to a further aspect of the third embodiment, oxide spacers may be formed on the sidewalls of the trenches so that only the bottom of each trench provides an electrical connection between a semi-insulating region and the drift region. These oxide spacers act to reduce leakage current by reducing the surface area of the junction (or interface) between the semi-insulating region in the trench and the drift region. The oxide spacers also facilitate the use of oxygen doped amorphous or polycrystalline silicon as the semi-insulating material by increasing the rate of nucleation during a deposition process to form the semi-insulating regions in the trenches. This aspect of the third embodiment is illustrated by the unit cell device FIG. 14, where the thickness of the oxide spacers is 2000 Å. Moreover, as illustrated by the simulated graph of FIG. 15, the addition of the oxide spacers and the P+ region at the top of the semi-insulating region resulted in substantial reduction in the electric field strength at the Schottky contact. In particular, FIG. 15 is a graph that illustrates a simulated electric field profile in a Schottky rectifier according to the embodiment of FIG. 14. The graph's y-axis specifies the magnitude of the electric field and the x-axis specifies the distance into the linearly graded drift region mesa (relative to the Schottky contact interface).

Figure 10:
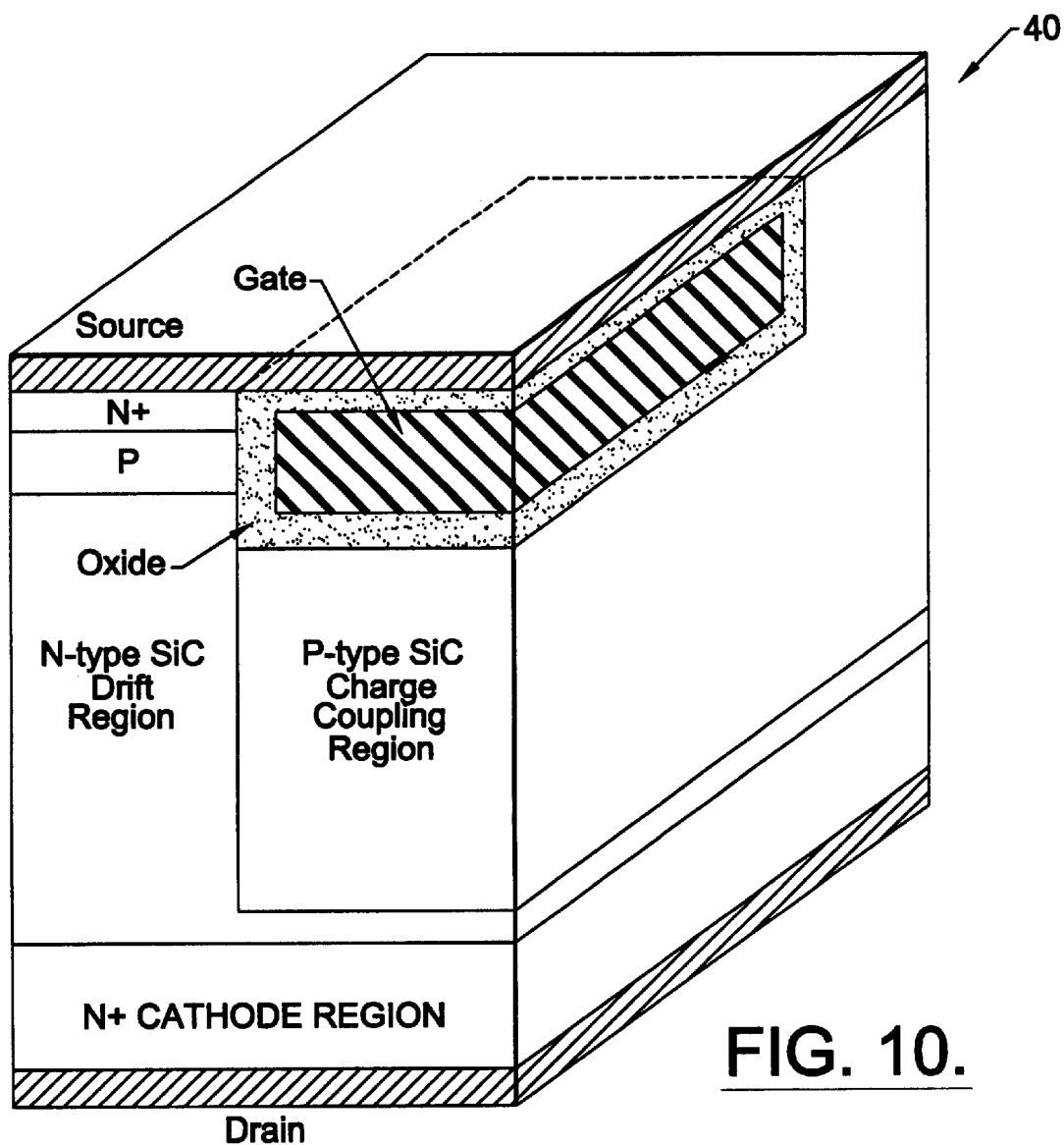
FIG. 10 is a three-dimensional cross-sectional view of a silicon carbide power MOSFET according to a fourth embodiment of the present invention.

Referring now to FIG. 10, a preferred silicon carbide power device 40 according to a fourth embodiment of the present invention will be described. In particular, FIG. 10 illustrates a unit cell of a preferred silicon carbide MOSFET having an insulated gate electrode adjacent a top of a trench and a uniformly doped silicon carbide charge coupling region of second conductivity type (e.g., P-type) adjacent a bottom of the trench. The relationships described above by equations (1) and (2) also apply to the device of FIG. 10. The charge coupling region can be formed using epitaxial growth and in-situ doping techniques, after forming a trench in an N-type silicon carbide epitaxial layer (containing P-base/channel and N+ source regions formed by ion-implantation). The construction, fabrication and operation of silicon carbide MOSFETs having trench-based insulated gate electrodes is more fully described in U.S. Pat. No. 5,742,076 to Sridevan et al. entitled "Silicon Carbide Switching Devices Having Near Ideal Breakdown Voltage Capability and Ultralow On-State Resistance", assigned to the present assignee, the disclosure of which is hereby incorporated herein by reference. The charge coupling region serves to improve the electric field profile in the drift region mesa. This improvement enables the power device 40 to support significantly higher voltages with extremely low on-state resistance (well below the ideal specific on-state resistance). Moreover, because the charge coupling region also acts to reduce the magnitude of the electric fields in the gate insulator when the device 40 is blocking large voltages, the likelihood of insulator breakdown can be reduced.

Numerical simulations of the device of FIG. 10 illustrate that like the devices of FIGS. 2 and 5, very uniform electric field profiles can be achieved in the drift region mesa (underneath the P-type base/channel region) with very little field crowding adjacent the gate insulator. Simulated impact ionization analysis also demonstrated that breakdown occurred in the P-type charge coupling region and not in the N-type drift region mesa. Accordingly, during the onset of breakdown, current is diverted away from the parasitic NPN bipolar transistor formed by the N+ source region, P– base region and N-drift region. Simulations also illustrated that the device of FIG. 10 provides an excellent combination of high voltage vertical MOSFET characteristics: extremely low specific on-state resistance, uniform electric field profile in the drift region, low electric field crowding in the gate insulator and an avalanche breakdown clamp which inhibits turn-on of the parasitic NPN transistor.

According to a fifth embodiment of the present invention, the N-type uniformly doped silicon carbide drift region of FIG. 10 may be replaced by a silicon carbide drift region having a graded doping profile therein. The grading of the doping profile in the drift region may be as disclosed in U.S. Pat. No. 5,637,898 to Baliga, entitled "Vertical Field Effect Transistors Having Improved Breakdown Voltage Capability and Low On-State Resistance" assigned to the present assignee, the disclosure of which is hereby incorporated herein by reference. In this fifth embodiment, the uniformly doped silicon carbide charge coupling regions of second conductivity type in the trenches may also be replaced by semi-insulating (high resistivity) regions having a resistivity in a range between $10^{14}$–$10^{18}$ Ωcm. These semi-insulating regions may comprise vanadium doped silicon carbide or semi-insulating polysilicon doped with oxygen. A highly doped P+ region (e.g., P+ polysilicon) may also be provided in each trench, between a lowermost portion of a respective insulated gate electrode and a respective semi-insulating region. This P+ region may be formed by etching back the semi-insulating region in the trench and then depositing a polysilicon layer with P-type doping. Exposed upper sidewalls of the trench and the P-type polysilicon layer can then be thermally oxidized to form a gate oxide insulating layer. A polysilicon gate electrode material can then be deposited on the gate oxide insulating layer, at an upper portion of the trench. Accordingly, when each trench is viewed in transverse cross-section, an insulated gate electrode is provided at the top of the trench, a semi-insulating region is provided at the bottom of the trench and the highly doped P+ region is disposed between the insulated gate electrode and the semi-insulating region. The highly doped P+ region is also electrically connected to the semi-insulating region. The semi-insulating region at the bottom of the trench provides charge coupling with the N-type drift region so that both portions are depleted when blocking reverse voltages. This results in an improved electric field profile in the drift region, notwithstanding the fact that the drift region is highly doped in order to reduce on-state resistance. According to a further aspect of the fifth embodiment, thin oxide spacers may be formed which line the sidewalls of the trenches so that only the bottom of each trench provides an electrical connection between a semi-insulating region and the drift region.

Numerical simulations of the fifth embodiment were performed. In these simulations of a unit cell device, the drift region had a linearly graded doping profile that increased from a level of $3 \times 10^{15}$ cm$^{-3}$ at the Schottky contact to a level of $3 \times 10^{16}$ cm$^{-3}$ at the cathode region 13 (at a gradient of $2 \times 10^{19}$ cm$^{-4}$). A trench depth of 13 microns was also used. Based on these parameters, the breakdown voltage of the improved MOSFET was determined to be 2500 volts. Numerical simulations also demonstrated that the P+ region shields the gate oxide from electric field crowding.

Figure 11:
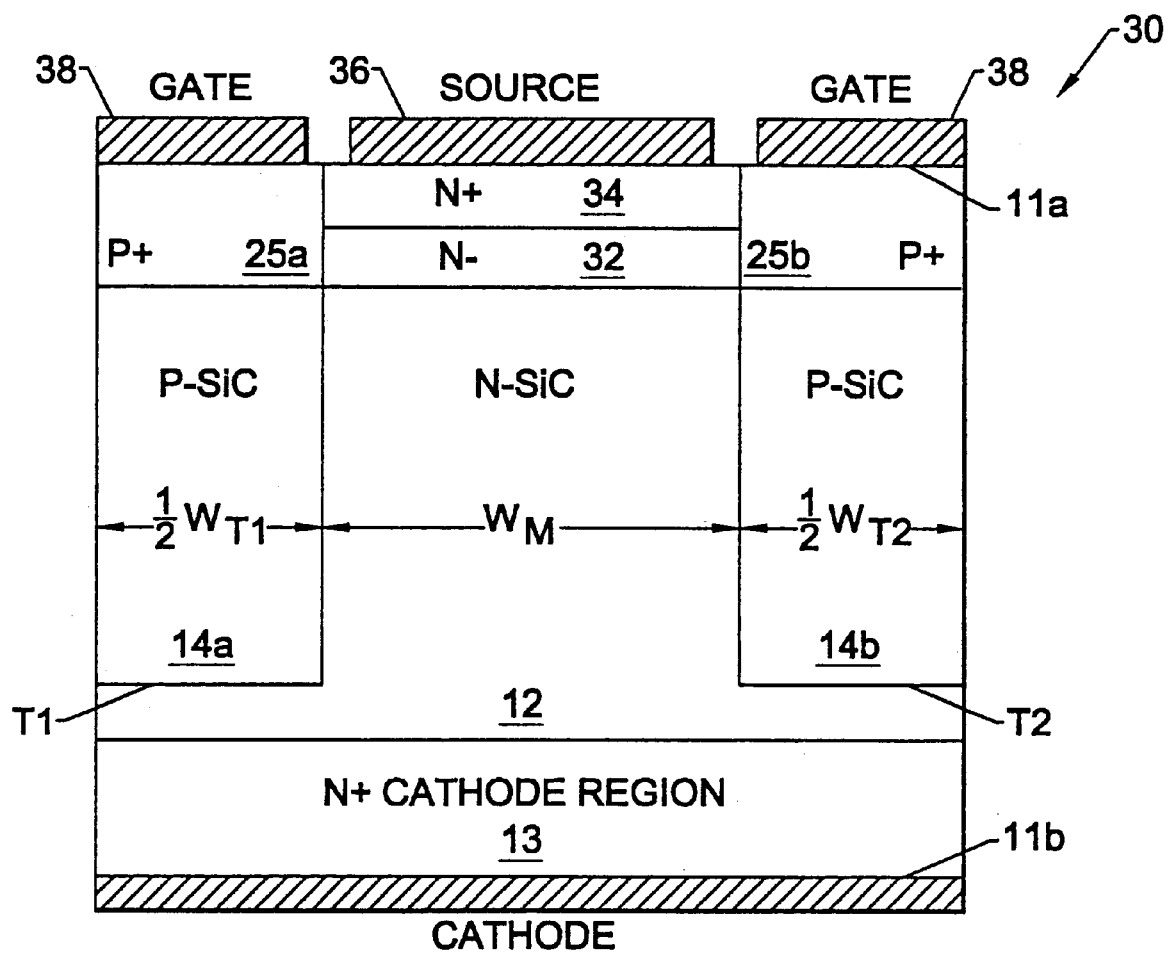
FIG. 11 is a cross-sectional view of a silicon carbide power JFET according to a sixth embodiment of the present invention.

Referring now to FIG. 11, a preferred silicon carbide junction field effect transistor (JFET) according to a sixth embodiment of the present invention will be described. As illustrated, this JFET 30 comprises a silicon carbide substrate having first and second opposing faces 11a and 11b thereon and a highly doped cathode region 13 therein. The silicon carbide substrate also has a uniformly doped silicon carbide drift region 12 of first conductivity type (e.g., N-type) therein. First and second trenches T1 and T2 having widths $W_{T1}$ and $W_{T2}$, respectively, are also provided in the uniformly doped silicon carbide drift region 12. As illustrated, the first and second trenches define a silicon carbide drift region mesa therebetween having a width $W_M$ and a first conductivity type doping concentration $N_{DM}$ therein. First and second uniformly doped silicon carbide charge coupling regions 14a and 14b of second conductivity type (e.g., P-type) are also provided in the first and second trenches, respectively. The first uniformly doped silicon carbide charge coupling region 14a forms a first P-N rectifying junction with the silicon carbide drift region 12 along a sidewall and bottom of the first trench and the second uniformly doped silicon carbide charge coupling region 14b forms a second P-N rectifying junction with the silicon carbide drift region 12 along a sidewall and bottom of the second trench. These silicon carbide charge coupling regions 14a and 14b of a unit cell device are preferably formed using epitaxial growth and in-situ doping techniques.

A relatively lightly doped silicon carbide channel region 32 of first conductivity type (e.g., N-type) and a more highly doped silicon carbide source region 34 are also provided on the silicon carbide drift region mesa, as illustrated. Highly doped silicon carbide gate regions 25a and 25b of second conductivity type are also provided on the charge coupling regions 14a and 14b. A source electrode 36 and a gate electrode 38 are also provided on the source region 34 and gate regions (25a and 25b), respectively. As determined by the inventor herein, the combination of the N– channel region 32 and the P+ gate regions 25a and 25b operate to improve pinch off of the channel region 32 and thereby provide high blocking voltage gain.

Numerical simulations were performed to illustrate the operation of the device of FIG. 11. For these simulations, the doping concentrations in the drift region mesa and charge coupling regions were set at $1 \times 10^{17}$ cm$^{-3}$ and the trench depth was set to 13 microns. The trench and mesa widths were set at 1 micron. Based on simulation, the breakdown voltage for the device of FIG. 11 was determined to be 4000 volts for a gate bias of –20 volts. Simulations also reveal that while some current constriction takes place in the channel region 32, the on-state voltage drop at a current density of 100 A/cm$^2$ is an extremely small value at 0.6 volts at a temperature of 393K. This value corresponds to a specific on-state resistance of only 5.9 milliOhm-cm$^2$ for a 4000 volt device. The blocking voltage gain was also determined to be 280 which means the device can be controlled with very small gate voltages. The device is also suitable as a component of the three terminal device disclosed by U.S. Pat. No. 5,396,085 to Baliga entitled, "Silicon Carbide Switching Device with Rectifying Gate", assigned to the present assignee, the disclosure of which is hereby incorporated herein by reference.

Figure 12:
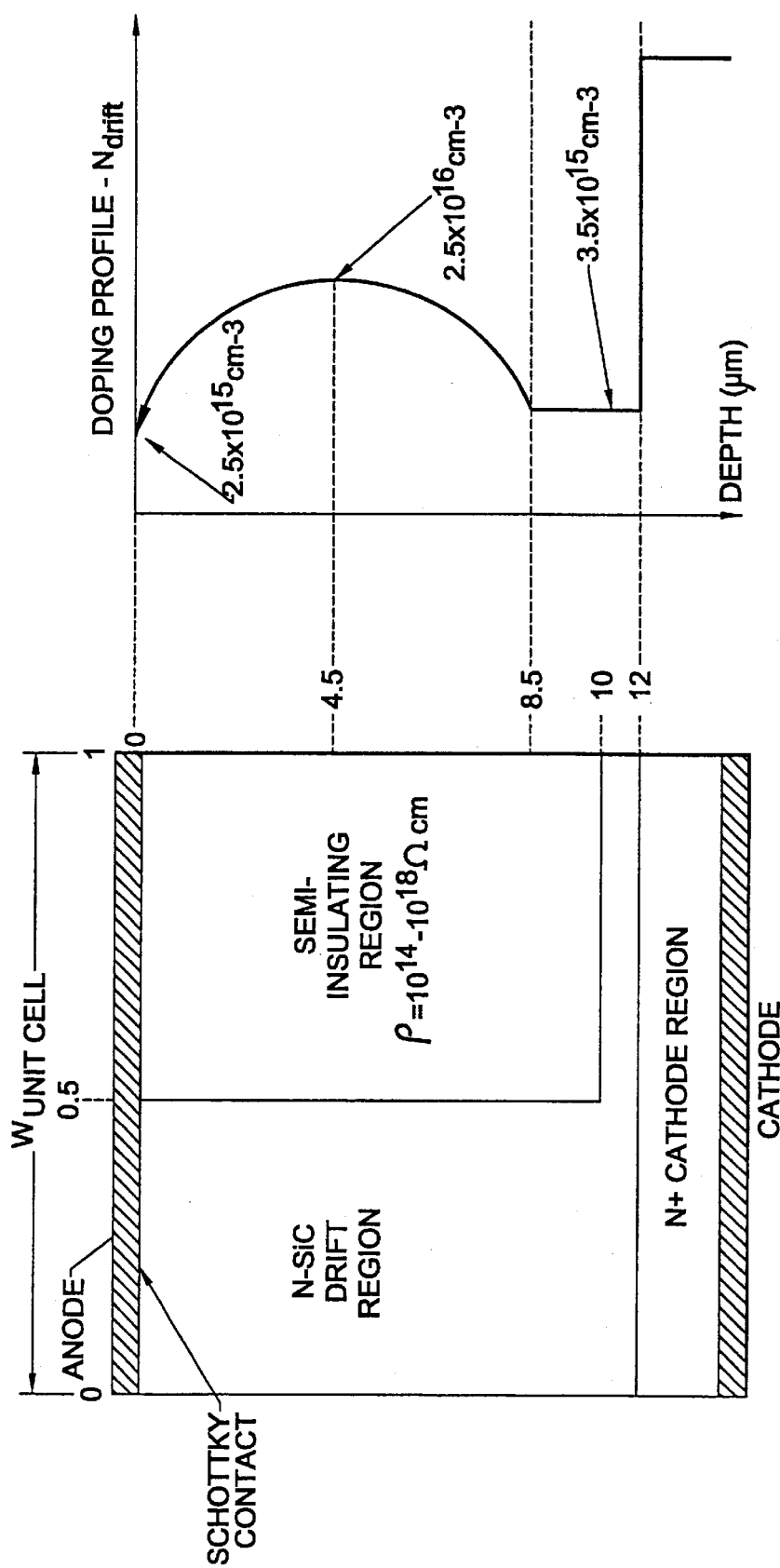
FIG. 12 is a cross-sectional view of a silicon carbide Schottky rectifier according to a seventh embodiment of the present invention.
Figure 13:
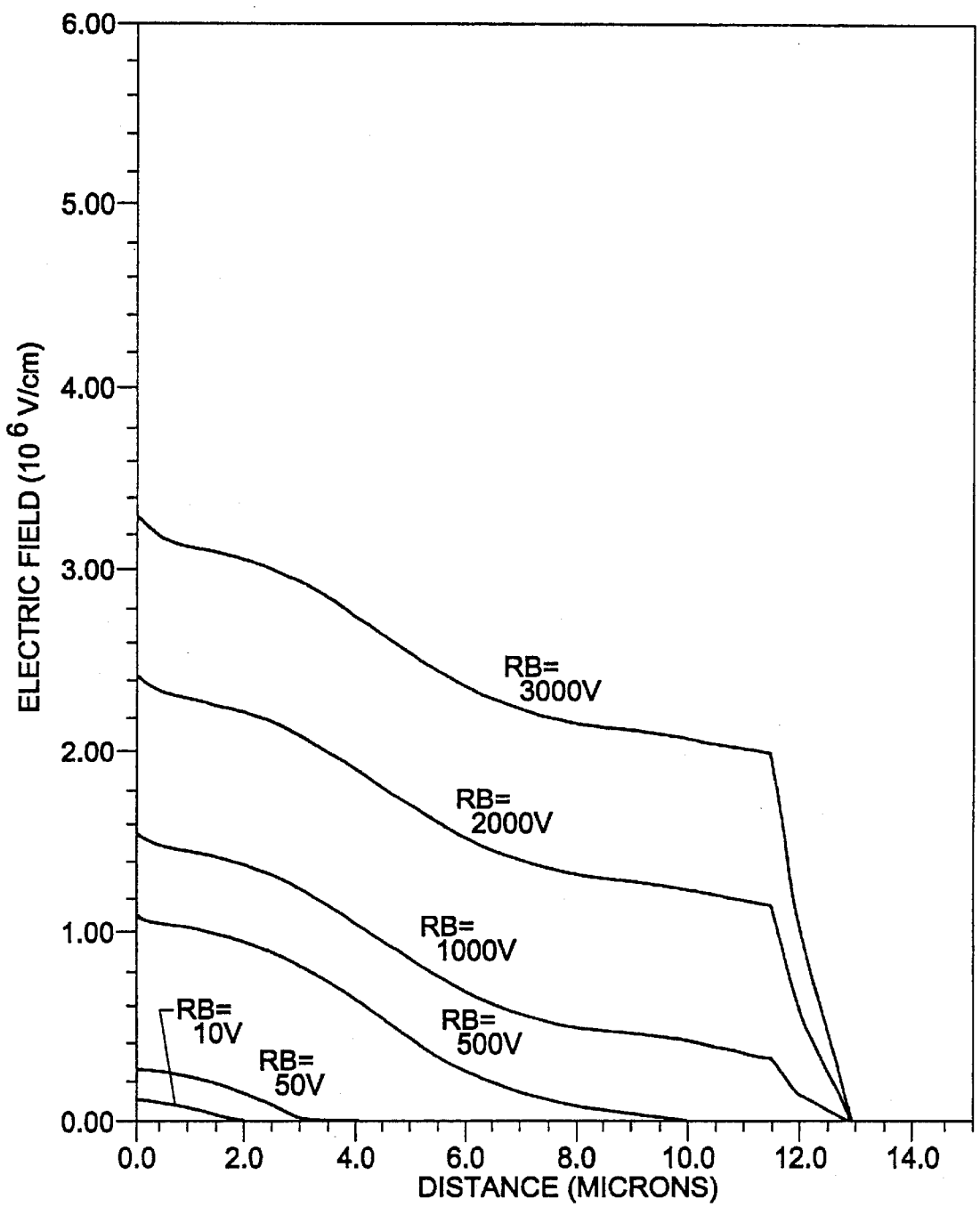
FIG. 13 is a graph that illustrates a simulated electric field profile in a Schottky rectifier according to the embodiment of FIG. 12. The graph's y-axis specifies the magnitude of the electric field and the x-axis specifies the distance into the nonuniformly doped drift region mesa (relative to the Schottky contact interface).

Referring now to FIG. 12, a silicon carbide Schottky rectifier according to a seventh embodiment of the present invention is illustrated. This embodiment is similar to the third embodiment, however, a silicon carbide drift region is provided having an arcuate-shaped doping profile. As illustrated on the right side of FIG. 12, the first conductivity type doping concentration in the drift region mesa may increase from a level of about $2.5 \times 10^{15}$ cm$^{-3}$ at the Schottky rectifying contact to a maximum doping concentration of about $2.5 \times 10^{16}$ cm$^{-3}$ at a drift region depth of about 4.5 microns (for a trench having a depth of about 10 microns). The doping concentration also drops from the maximum level to a level of about $3.5 \times 10^{15}$ cm$^{-3}$ at a drift region depth of about 8.5 microns. Based on simulation, this arcuate shaped drift region doping profile has been shown to improve the electric field distribution in the drift region. For example, the electric field profiles illustrated by FIG. 13 (for reverse biases RB=3000, 2000, 1000, 500, 50 and 10 Volts) indicate an excellent and substantially uniform electric field distribution over most of the drift region mesa. These simulated field profiles were based on a unit cell device having a width ($W_{unit\ cell}$) of 1 micron, a drift region thickness of 12 microns, a trench depth of 10 microns and a semi-insulating region modeled as a silicon carbide region having a net first conductivity type doping concentration therein of $1 \times 10^{1}$ cm$^{-3}$ (which corresponds to a resistivity of $10^{14}$ Ωcm).

In the drawings and specification, there have been disclosed typical preferred embodiments of the invention and, although specific terms are employed, they are used in a generic and descriptive sense only and not for purposes of That which is claimed is:

1. A silicon carbide Schottky rectifier, comprising:
   a silicon carbide substrate having a uniformly doped silicon carbide drift region of first conductivity type therein;
   first and second trenches having widths $W_{T1}$, and $W_{T2}$, respectively, in said uniformly doped silicon carbide drift region, said first and second trenches defining a silicon carbide drift region mesa therebetween having a width $W_M$ and a first conductivity type doping concentration $N_{DM}$ therein;
   first and second uniformly doped silicon carbide charge coupling regions of second conductivity type in said first and second trenches, respectively, said first uniformly doped silicon carbide charge coupling region forming a first P-N rectifying junction with said silicon carbide drift region mesa along a sidewall of said first trench and said second uniformly doped silicon carbide charge coupling region forming a second P-N rectifying function with said silicon carbide drift region mesa along a sidewall of said second trench; and
   a Schottky rectifying contact on said silicon carbide drift region mesa;
   wherein the second conductivity type doping concentrations in said first and second silicon carbide charge coupling regions equal $N_{CC1}$ and $N_{CC2}$, respectively;
   wherein $0.5 \times 10^{13}$ cm$^{-2} \leq (N_{DM})(W_M) \leq 5.0 \times 10^{13}$ cm$^{-2}$; and wherein $(N_{DM})(W_M) = \frac{1}{2}(N_{CC1})(W_{T1}) + \frac{1}{2}(N_{CC2})(W_{T2})$.

2. The Schottky rectifier of claim 1, further comprising a first silicon carbide contact region of first conductivity type on said silicon carbide drift region mesa and forming a nonrectifying junction therewith, said first silicon carbide contact region having a net majority carrier doping concentration therein of less than $5 \times 10^{16}$ cm$^{-3}$; and wherein said Schottky rectifying contact forms a Schottky rectifying junction with said first silicon carbide contact region.

3. The Schottky rectifier of claim 2, further comprising a second silicon carbide contact region of second conductivity type in said first trench, said second silicon carbide contact region having a net majority carrier doping concentration therein of greater than $5 \times 10^{17}$ cm$^{-3}$ and forming a nonrectifying junction with said first uniformly doped silicon carbide charge coupling region.

4. A silicon carbide power device, comprising:
   a silicon carbide substrate having a uniformly doped silicon carbide drift region of first conductivity type therein;
   first and second trenches having widths $W_{T1}$, and $W_{T2}$, respectively, in said uniformly doped silicon carbide drift region, said first and second trenches defining a silicon carbide drift region mesa therebetween having a width $W_M$ and a first conductivity type doping concentration $N_{DM}$ therein;
   first and second uniformly doped silicon carbide charge coupling regions of second conductivity type in said first and second trenches, respectively, said first uniformly doped silicon carbide charge coupling region forming a first P-N rectifying junction with said silicon carbide drift region mesa along a sidewall of said first trench and said second uniformly doped silicon carbide charge coupling region forming a second P-N rectifying junction with said silicon carbide drift region mesa along a sidewall of said second trench;
   wherein the second conductivity type doping concentrations in said first and second silicon carbide charge coupling regions equal $N_{CC1}$ and $N_{CC2}$; respectively;
   wherein $0.5 \times 10^{13}$ cm$^{-2} \leq (N_{DM})(W_M) \leq 5.0 \times 10^{13}$ cm$^{-2}$; and
   wherein $(N_{DM})(W_M) = \frac{1}{2}(N_{CC1})(W_{T1}) + \frac{1}{2}(N_{CC2})(W_{T2})$.

5. The power device of claim 4, further comprising:
   a Schottky rectifying contact electrically coupled to said silicon carbide drift region mesa.

6. The power device of claim 5, further comprising a first silicon carbide contact region of first conductivity type on said silicon carbide drift region mesa and forming a nonrectifying junction therewith, said first silicon carbide contact region having a net majority carrier doping concentration therein of less than $5 \times 10^{16}$ cm$^{-3}$; and wherein said Schottky rectifying contact forms a Schottky rectifying junction with said first silicon carbide contact region.

7. The power device of claim 6, further comprising a second silicon carbide contact region of second conductivity type in said first trench, said second silicon carbide contact region having a net majority carrier doping concentration therein of greater than $5 \times 10^{17}$ cm$^{-3}$ and forming a nonrectifying junction with said first uniformly doped silicon carbide charge coupling region.

8. The power device of claim 4, further comprising an insulated gate electrode in said first trench; and wherein said first silicon carbide charge coupling region extends between said insulated gate electrode and a bottom of said first trench.

9. A silicon carbide power device, comprising:
   a silicon carbide substrate having a uniformly doped silicon carbide drift region of first conductivity type therein;
   first and second trenches having widths $W_{T1}$ and $W_{T2}$, respectively, in said uniformly doped silicon carbide drift region, said first and second trenches defining a silicon carbide drift region mesa therebetween having a width $W_M$ and a first conductivity type doping concentration $N_{DM}$ therein;
   an insulated gate electrode in said first trench;
   first and second uniformly doped silicon carbide charge coupling regions of second conductivity type in said first and second trenches, respectively, said first uniformly doped silicon carbide charge coupling region forming a first P-N rectifying junction with said silicon carbide drift region mesa along a sidewall of said first trench and said second uniformly doped silicon carbide charge coupling region forming a second P-N rectifying function with said silicon carbide drift region mesa along a sidewall of said second trench; and
   a silicon carbide base region of second conductivity type on said silicon carbide drift region mesa, said silicon carbide base region extending to the sidewall of said first trench and forming a rectifying junction with said silicon carbide drift region at a location opposite said insulated gate electrode;
   wherein said first silicon carbide charge coupling region extends between said insulated gate electrode and a bottom of said first trench;
   wherein the second conductivity type doping concentrations in said first and second silicon carbide charge coupling regions equal $N_{CC1}$ and $N_{CC2}$, respectively;
   wherein $0.5 \times 10^{13}$ cm$^{-2} \leq (N_{DM})(W_M) \leq 5.0 \times 10^{13}$ cm$^{-2}$; and
   wherein $(N_{DM})(W_M) = \frac{1}{2}(N_{CC1})(W_{T1}) + \frac{1}{2}(N_{CC2})(W_{T2})$.

10. The power device of claim 5, further comprising: a silicon carbide source region of first conductivity type on said silicon carbide drift region mesa, said silicon carbide source region disposed between said silicon carbide drift region and a first face of said silicon carbide substrate and having a majority carrier doping concentration therein of greater than $5\times10^{17}$ cm$^{-3}$ cm$^{-3}$ and greater than $N_{DM}$; and a silicon carbide gate region of second conductivity type in said first trench, said silicon carbide gate region disposed between said silicon carbide charge coupling region and the first face and having a majority carrier doping concentration therein of greater than $5\times10^{17}$ cm$^{-3}$ and greater than $N_{CC1}$.

11. The power device of claim 10, further comprising a silicon carbide channel region of first conductivity type extending between said silicon carbide source region and said silicon carbide drift region, said silicon carbide channel region having a majority carrier doping concentration therein of less than $5\times10^{16}$ cm$^{-3}$ and less than $N_{DM}$.

12. A silicon carbide power device, comprising:

a silicon carbide substrate having a uniformly doped silicon carbide drift region of first conductivity type therein;

first and second trenches having widths $W_{T1}$, and $W_{T2}$, respectively, in said uniformly doped silicon carbide drift region, said first and second trenches defining a silicon carbide drift region mesa therebetween having a width $W_M$ and a first conductivity type doping concentration $N_{DM}$ therein;

a first insulated gate electrode in said first trench;

a second gate electrode in said second trench;

a first uniformly doped silicon carbide charge coupling region of second conductivity type extending between said first insulated gate electrode and a bottom of said first trench and forming a first P-N rectifying junction with said silicon carbide drift region mesa along a sidewall of said first trench;

a second uniformly doped silicon carbide charge coupling region of second conductivity type extending in said second trench and forming a second P-N rectifying junction with said silicon carbide drift region mesa along a sidewall of said second trench, said first and second uniformly doped silicon carbide charge coupling regions having sufficient second conductivity type charge therein to provide matched charge coupling across said silicon carbide drift region mesa; and a silicon carbide base region of second conductivity type on said silicon carbide drift region mesa, said silicon carbide base region extending to the sidewall of said first trench and forming a rectifying junction with said silicon carbide drift region mesa.

13. The power device of claim 12, wherein $0.5\times10^{13}$ cm$^{-2} \leq (N_{DM})(W_M) \leq 5.0\times10^{13}$ cm$^{-2}$.

14. The power device of claim 12, wherein the second conductivity type doping concentrations in said first and second silicon carbide charge coupling regions equal $N_{CC1}$, and $N_{CC2}$, respectively; and wherein $\frac{1}{2}(N_{CC1})(W_{T1}) + \frac{1}{2}(N_{CC2})(W_{T2}) \leq 5.0\times10^{13}$ cm$^{-2}$.

15. The power device of claim 13, wherein the second conductivity type doping concentrations in said first and second silicon carbide charge coupling regions equal $N_{CC1}$, and $N_{CC2}$, respectively; and wherein $\frac{1}{2}(N_{CC1})(W_{T1}) + \frac{1}{2}(N_{CC2})(W_{T2}) \leq 5.0\times10^{13}$ cm$^{-2}$.

16. The power device of claim 15, wherein $(N_{DM})(W_M) = \frac{1}{2}(N_{CC1})(W_{T1}) + \frac{1}{2}(N_{CC2})(W_{T2})$.

17. A silicon carbide power device, comprising:

a silicon carbide substrate having a uniformly doped silicon carbide drift region of first conductivity type therein;

first and second trenches having widths $W_{T1}$ and $W_{T2}$, respectively, in said uniformly doped silicon carbide drift region, said first and second trenches defining a silicon carbide drift region mesa therebetween having a height, a width $W_M$ and a first conductivity type doping concentration $N_{DM}$ therein; and first and second uniformly doped silicon carbide charge coupling regions of second conductivity type within said first and second trenches, respectively, said first uniformly doped silicon carbide charge coupling region forming a first P-N rectifying junction with said silicon carbide drift region mesa along a sidewall and bottom of said first trench and said second uniformly doped silicon carbide charge coupling region forming a second P-N rectifying junction with said silicon carbide drift region mesa along a sidewall and bottom of said second trench, and wherein said first and second uniformly doped silicon carbide charge coupling regions are of sufficient thickness within said first and second trenches, respectively, to provide charge coupling over at least a majority of the height of said silicon carbide drift region mesa;

wherein the second conductivity type doping concentrations in said first and second silicon carbide charge coupling regions equal $N_{CC1}$ and $N_{CC2}$, respectively;

wherein $0.5\times10^{13}$ cm$^{-2} \leq (N_{DM})(W_M) \leq 5.0\times10^{13}$ cm$^{-2}$; and wherein $0.5\times10^{13}$ cm$^{-2} \leq \frac{1}{2}(N_{CC1})(W_{T1}) + \frac{1}{2}(N_{CC2})(W_{T2}) \leq 5.0\times10^{13}$ cm$^{-2}$.

\* \* \* \* \*

UNITED STATES PATENT AND TRADEMARK OFFICE
CERTIFICATE OF CORRECTION

PATENT NO. : 6,313,482 B1  
DATED : November 6, 2001  
INVENTOR(S) : Bantval Jayant Baliga Page 1 of 1

It is certified that error appears in the above-identified patent and that said Letters Patent is hereby corrected as shown below:

Column 14,  
Line 50, change "function" to -- junction --.

Column 15,  
Line 7, delete the second occurrence of "$cm^{-3}$".

Signed and Sealed this

Twelfth Day of March, 2002

Attest:

JAMES E. ROGAN  
Attesting Officer  
*Director of the United States Patent and Trademark Office*